United States Patent
Cheon et al.

(10) Patent No.: US 11,508,744 B2
(45) Date of Patent: Nov. 22, 2022

(54) MEMORY DEVICES AND METHODS OF MANUFACTURING THE SAME

(71) Applicant: Samsung Electronics Co., Ltd., Suwon-si (KR)

(72) Inventors: Jisung Cheon, Ansan-si (KR); Kiyoon Kang, Seoul (KR)

(73) Assignee: Samsung Electronics Co., Ltd.

( * ) Notice: Subject to any disclaimer, the term of this patent is extended or adjusted under 35 U.S.C. 154(b) by 231 days.

(21) Appl. No.: 16/903,990

(22) Filed: Jun. 17, 2020

(65) Prior Publication Data

US 2021/0151452 A1 May 20, 2021

(30) Foreign Application Priority Data

Nov. 14, 2019 (KR) .......................... 10-2019-0146172

(51) Int. Cl.
| | | |
|---|---|---|
| *H01L 27/11556* | (2017.01) | |
| *G11C 5/02* | (2006.01) | |
| *G11C 5/06* | (2006.01) | |
| *H01L 27/11582* | (2017.01) | |
| *H01L 29/792* | (2006.01) | |

(52) U.S. Cl.
CPC ........ *H01L 27/11556* (2013.01); *G11C 5/025* (2013.01); *G11C 5/06* (2013.01); *H01L 27/11582* (2013.01); *H01L 29/7926* (2013.01)

(58) Field of Classification Search
CPC ......... H01L 27/11556; H01L 27/11582; H01L 27/11563; H01L 27/11568; H01L 27/11578; H01L 27/1157; H01L 27/11573; H01L 29/7926; H01L 29/66833; H01L 29/792; G11C 5/025; G11C 5/06
See application file for complete search history.

(56) References Cited

U.S. PATENT DOCUMENTS

| | | |
|---|---|---|
| 8,409,977 B2 | 4/2013 | Shim et al. |
| 8,971,118 B2 | 3/2015 | Jin et al. |
| 9,768,192 B1 | 9/2017 | Nakamura |
| 10,224,240 B1 | 3/2019 | Funayama et al. |
| 10,283,493 B1* | 5/2019 | Nishida ............. H01L 27/11565 |
| 2010/0181610 A1 | 7/2010 | Kim et al. |
| 2015/0155296 A1* | 6/2015 | Yoon ................... H01L 29/7926 257/324 |

(Continued)

OTHER PUBLICATIONS

Extended European Search Report Corresponding to European Application No. 20190146.9 (9 pages) (dated Jan. 25, 2021).

*Primary Examiner* — Sitaramarao S Yechuri
(74) *Attorney, Agent, or Firm* — Myers Bigel, P.A.

(57) ABSTRACT

A memory device may include a substrate; a first stack structure comprising a plurality of first gate layers and a plurality of first interlayer insulating layers alternately stacked on the substrate; a second stack structure comprising a plurality of second gate layers and a plurality of second interlayer insulating layers alternately stacked on the first stack structure; and a channel structure penetrating the first stack structure and the second stack structure, wherein the channel structure comprises a first portion in a first channel hole penetrating the first stack structure, a second portion in a second channel hole penetrating the second stack structure, and a first protrusion located in a first recess recessed into one layer of the plurality of first interlayer insulating layers from a side portion of the first channel hole.

20 Claims, 34 Drawing Sheets

(56) References Cited

U.S. PATENT DOCUMENTS

| | | | |
|---|---|---|---|
| 2017/0345843 A1* | 11/2017 | Lee | ................... H01L 23/528 |
| 2019/0081060 A1 | 3/2019 | Lu et al. | |
| 2019/0081061 A1 | 3/2019 | Tessariol et al. | |
| 2019/0214405 A1* | 7/2019 | Shirai | ................... H01L 29/517 |
| 2019/0312055 A1 | 10/2019 | Baek et al. | |

* cited by examiner

MEMORY DEVICES AND METHODS OF MANUFACTURING THE SAME

CROSS-REFERENCE TO RELATED APPLICATION

This application claims the benefit of Korean Patent Application No. 10-2019-0146172, filed on Nov. 14, 2019, in the Korean Intellectual Property Office, the disclosure of which is incorporated herein in its entirety by reference.

BACKGROUND

The present disclosure relates to memory devices and methods of manufacturing the memory device. As multi-functional, high-performance, and small electronic devices are increasingly demanded, large capacity and high integration of memory devices may also be increasingly demanded. Accordingly, a vertical memory device in which a plurality of memory cell arrays are stacked in a vertical direction has been proposed. For example, a vertical memory device including a plurality of stacked gate layers and a channel structure vertically penetrating the plurality of stacked gate layers has been proposed.

SUMMARY

The present disclosure provides a memory device with an improved process yield and a method of manufacturing the memory device.

According to an aspect of the present disclosure, there is provided a memory device including a substrate; a first stack structure including a plurality of first gate layers and a plurality of first interlayer insulating layers alternately stacked on the substrate; a second stack structure including a plurality of second gate layers and a plurality of second interlayer insulating layers alternately stacked on the first stack structure; and a channel structure penetrating the first stack structure and the second stack structure, and wherein the channel structure includes a first portion in a first channel hole penetrating the first stack structure, a second portion in a second channel hole penetrating the second stack structure, and a first protrusion located in a first recess recessed into one layer of the plurality of first interlayer insulating layers from a side portion of the first channel hole.

According to another aspect of the present disclosure, there is provided a memory device including a substrate; a first stack structure including a plurality of first gate layers and a plurality of first interlayer insulating layers alternately stacked on the substrate; a second stack structure including a plurality of second gate layers and a plurality of second interlayer insulating layers alternately stacked on the first stack structure; and a channel structure penetrating the first stack structure and the second stack structure, and wherein the plurality of first gate layers includes a plurality of first active gate layers stacked on the substrate and an upper first dummy gate layer on the plurality of first active gate layers, wherein the plurality of first interlayer insulating layers includes an upper first interlayer insulating layer on the upper first dummy gate layer and a lower first interlayer insulating layer below the upper first dummy gate layer, wherein a planar area of a portion of the channel structure penetrating the upper first dummy gate layer is greater than a planar area of a portion of the channel structure penetrating the upper first interlayer insulating layer and a planar area of a portion of the channel structure penetrating the lower first interlayer insulating layer, and wherein a planar area of a portion of the channel structure penetrating a lowermost layer among the plurality of second gate layers is less than the planar area of the portion of the channel structure penetrating the upper first interlayer insulating layer.

According to another aspect of the present disclosure, there is provided a memory device including a substrate; a first stack structure including a plurality of first active gate layers on the substrate, a plurality of first dummy gate layers on the plurality of first active gate layers, and a plurality of first interlayer insulating layers separating the plurality of first active gate layers and the plurality of first dummy gate layers from each other; a second stack structure including a plurality of second gate layers on the first stack structure, and a plurality of second interlayer insulating layers separating the plurality of second gate layers from each other; and a plurality of channel structures each penetrating the first stack structure and the second stack structure, wherein each of the plurality of channel structures includes a first portion penetrating the first stack structure, a second portion penetrating the second stack structure, and a plurality of protrusions protruding from a side surface of the first portion.

According to another aspect of the present disclosure, there is provided a method of manufacturing a memory device including forming a first preliminary stack structure including a plurality of first sacrificial layers and a plurality of first interlayer insulating layers alternately stacked on a substrate; forming a first channel hole penetrating the first preliminary stack structure; forming at least one recess recessed into at least one of the plurality of first interlayer insulating layers from a side portion of the first channel hole; forming a channel etch stop layer in the first channel hole and the at least one recess; forming a second preliminary stack structure including a plurality of second sacrificial layers and a plurality of second interlayer insulating layers alternately stacked on the first preliminary stack structure; forming a second channel hole penetrating the second preliminary stack structure and exposing a portion of a top surface of the channel etch stop layer; removing the channel etch stop layer; forming a channel structure in the first channel hole, the second channel hole, and the at least one recess; and replacing the plurality of first sacrificial layers and the plurality of second sacrificial layers with a plurality of first gate layers and a plurality of second gate layers, respectively.

According to another aspect of the present disclosure, there is provided a method of manufacturing a memory device including forming a first preliminary stack structure including a plurality of first sacrificial layers and a plurality of first interlayer insulating layers alternately stacked on a substrate; forming a first channel hole penetrating the first preliminary stack structure; forming at least one recess recessed into at least one of the plurality of first sacrificial layers from a side portion of the first channel hole; forming a channel etch stop layer in the first channel hole and the at least one recess; forming a second preliminary stack structure including a plurality of second sacrificial layers and a plurality of second interlayer insulating layers alternately stacked on the first preliminary stack structure; forming a second channel hole penetrating the second preliminary stack structure and exposing a portion of a top surface of the channel etch stop layer; removing the channel etch stop layer; forming a channel structure in the first channel hole, the second channel hole, and the at least one recess; and replacing the plurality of first sacrificial layers and the plurality of second sacrificial layers with a plurality of first gate layers and a plurality of second gate layers, respectively.

According to another aspect of the present disclosure, there is provided a method of manufacturing a memory device including forming a first preliminary stack structure including a plurality of first sacrificial layers and a plurality of first interlayer insulating layers alternately stacked on a substrate; forming a second preliminary stack structure including a plurality of second sacrificial layers and a plurality of second interlayer insulating layers alternately stacked on the first preliminary stack structure; forming a channel structure penetrating the first preliminary stack structure and the second preliminary stack structure; and replacing the plurality of first sacrificial layers and the plurality of second sacrificial layers with a plurality of first gate layers and a plurality of second gate layers, respectively, wherein the channel structure includes a first portion in a first channel hole penetrating the first preliminary stack structure, a second portion in a second channel hole penetrating the second preliminary stack structure, and a plurality of protrusions respectively located in a plurality of recesses horizontally recessed from a side portion of the first channel hole of the channel structure.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
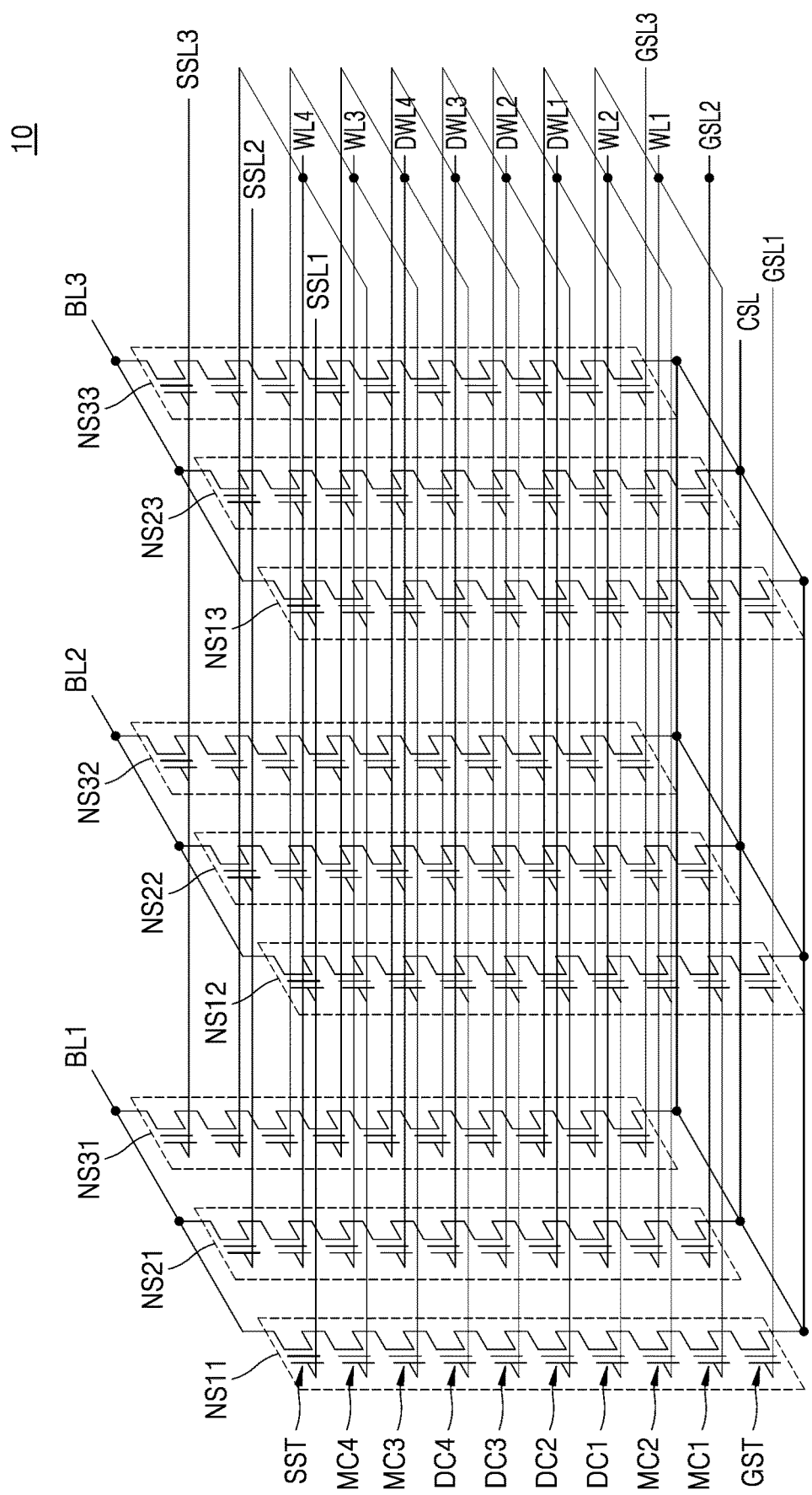
FIG. 1 is a circuit diagram schematically illustrating a memory device according to an embodiment of the present disclosure.

FIG. 1 is a circuit diagram schematically illustrating a memory device 10 according to an embodiment of the present disclosure.

Referring to FIG. 1, the memory device 10 may include a plurality of NAND strings NS11 to NS33. Although FIG. 1 illustrates that the memory device 10 may include the nine NAND strings NS11 to NS33, the number of NAND strings included in one memory device 10 is not limited thereto. Each of the NAND strings NS11 to NS33 may include at least one ground select transistor GST, a plurality of first memory cells MC1 and MC2, a plurality of first dummy cells DC1 and DC2, a plurality second dummy cells DC3 and DC4, a plurality of second memory cells MC3 and MC4, and at least one string select transistor SST which are connected in series. In FIG. 1, each of the NAND strings NS11 to NS33 may include one ground select transistor GST, two first memory cells MC1 and MC2, two first dummy cells DC1 and DC2, two second dummy cells DC3 and DC4, two second memory cells MC3 and MC4, and one string select transistor SST, but the number of ground select transistors, first memory cells, first dummy cells, second dummy cells, second memory cells, and string select transistors included in each of ground NAND strings NS11 to NS33 is not limited thereto.

The NAND strings NS11 to NS33 may be connected between bit lines BL1 to BL3 and a common source line CSL. Gates of the ground select transistors GST may be connected to ground select lines GSL1 to GSL3. Gates of the first memory cells MC1 and MC2 may be connected to first active word lines WL1 and WL2. Gates of the first dummy cells DC1 and DC2 may be connected to first dummy word lines DWL1 and DWL2. Gates of the second dummy cells DC3 and DC4 may be connected to second dummy word lines DWL3 and DWL4. Gates of the second memory cells MC3 and MC4 may be connected to second active word lines WL3 and WL4. Gates of the string select transistors SST may be connected to string select lines SS1 to SSL3.

Figure 2A:
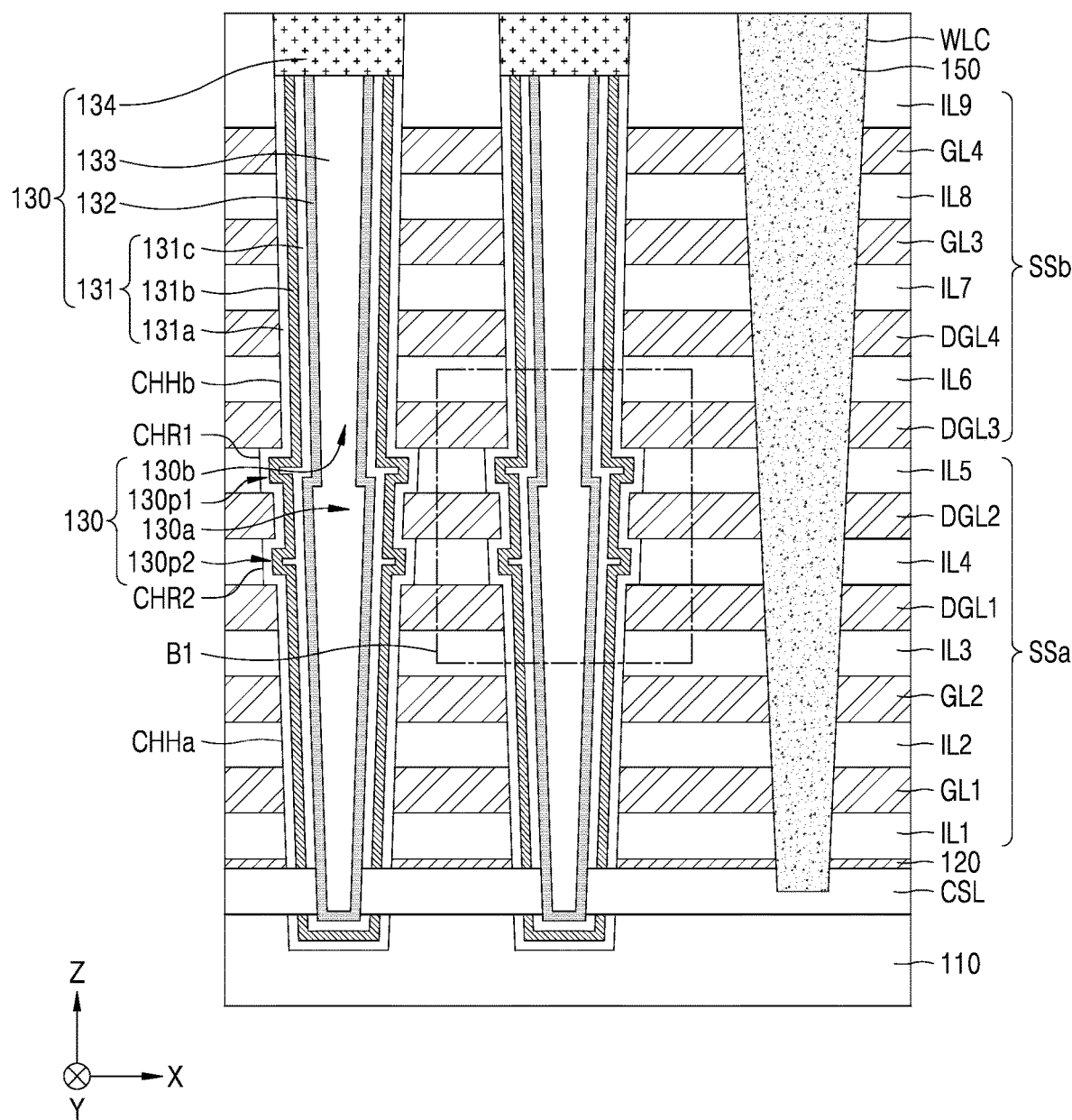
FIG. 2A is a schematic cross-sectional view of a memory device according to an embodiment of the present disclosure.
Figure 2B:
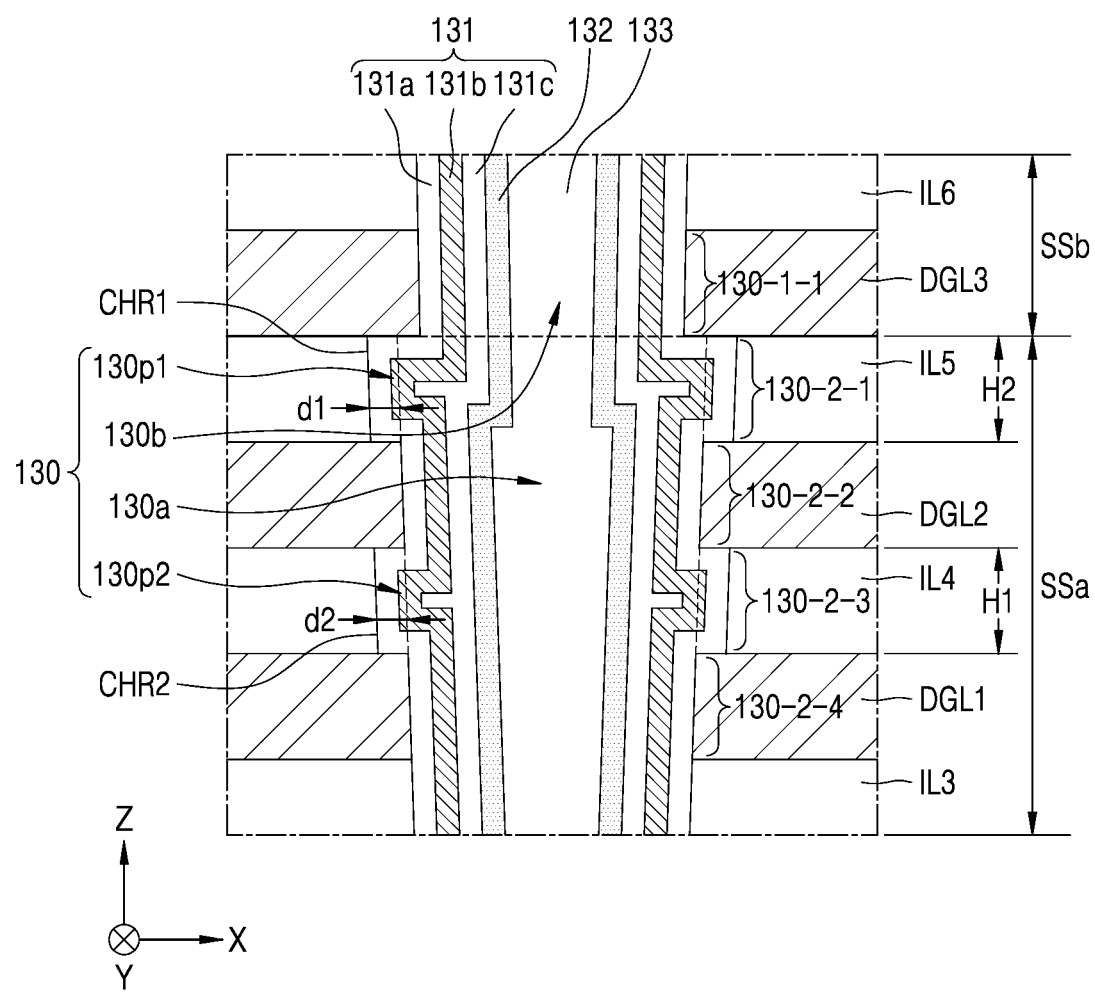
FIG. 2B is an enlarged view of a region B1 of FIG. 2A.

FIG. 2A is a schematic cross-sectional view of a memory device 100 according to an embodiment of the present disclosure. FIG. 2B is an enlarged view of a region B1 of FIG. 2A.

Referring to FIGS. 2A and 2B, the memory device 100 may include a substrate 110, a first stack structure SSa on the substrate 110, a second stack structure SSb on the first stack structure SSa, and a plurality of channel structures 130 which penetrate the first stack structure SSa and the second stack structure SSb. In some embodiments, the memory device 100 may further include the common source line CSL between the substrate 110 and the first stack structure SSa. In some embodiments, the memory device 100 may further include a lower etch stop layer 120 between the common source line CSL and the first stack structure SSa. In some embodiments, the memory device 100 may further include an insulating structure 150 penetrating the first stack structure SSa and the second stack structure SSb.

The substrate 110 may include a semiconductor material including a group IV semiconductor material, a group III-V semiconductor material, a group II-VI semiconductor material, or a combination thereof. The group IV semiconductor material may include, for example, silicon (Si), germanium (Ge), or a combination thereof. The III-V semiconductor material may include, for example, gallium arsenide (GaAs), indium phosphide (InP), gallium phosphide (GaP), indium arsenide (InAs), indium antimony (InSb), or a combination thereof. The II-VI semiconductor material may include, for example, zinc telluride (ZnTe), cadmium sulfide (CdS), or a combination thereof.

The first stack structure SSa may include a plurality of first gate layers GL1, GL2, DGL1, and DGL2 and a plurality of first interlayer insulating layers IL1 to IL5 which are alternately stacked on the substrate 110 one by one. The plurality of first gate layers GL1, GL2, DGL1, and DGL2 may include the plurality of first active gate layers GL1 and GL2 stacked on the substrate 110 and the plurality of first dummy gate layers DGL1 and DGL2 on the plurality of first active gate layers GL1 and GL2. The plurality of first interlayer insulating layers IL1 to IL5 may separate the plurality of first active gate layers GL1 and GL2 and the plurality of first dummy gate layers DGL1 and DGL2 from each other. The plurality of first dummy gate layers DGL1 and DGL2 may include the upper first dummy gate layer DGL2 and the lower first dummy gate layer DGL1 below the upper first dummy gate layer DGL2. The uppermost layer IL5 among the plurality of first interlayer insulating layers IL1 to IL5 may also be referred to as an upper first interlayer insulating layer IL5. The upper first interlayer insulating layer IL5 may be located on the upper first dummy gate layer DGL2. The second highest layer IL4 among the plurality of first interlayer insulating layers IL1 to IL5 may also be referred to as a lower first interlayer insulating layer IL4. The lower first interlayer insulating layer IL4 may be positioned between the upper first dummy gate layer DGL2 and the lower first dummy gate layer DGL1.

The plurality of first active gate layers GL1 and GL2 may be included in the plurality of first memory cells MC1 and MC2 (see FIG. 1), respectively, and may be connected to the plurality of first active word lines WL1 and WL2 (see FIG. 1), respectively. The plurality of first dummy gate layers DGL1 and DGL2 may be included in the plurality of first dummy cells DC1 and DC2 (see FIG. 1), respectively, and may be connected to the plurality of first dummy word lines DWL1 and DWL2 (see FIG. 1), respectively. In some embodiments, the first stack structure SSa may further include an additional first active word line (not shown) below the plurality of first active word lines WL1 and WL2, and the additional first active word line (not shown) may be included in the ground select transistor GST and may be connected to one of the plurality of ground select lines GSL1 to GSL3 (see FIG. 1). In FIG. 2A, the first stack structure SSa may include two first active gate layers GL1 and GL2, two first dummy gate layers DGL1 and DGL2, and five first interlayer insulating layers IL1 to IL5, but the number of first active gate layers, first dummy gate layers, and first interlayer insulating layers included in the first stack structure SSa is not limited thereto.

The second stack structure SSb may include a plurality of second gate layers DGL3, DGL4, GL3, and GL4 and a plurality of second interlayer insulating layers IL6 to IL9 that are alternately stacked one by one on the first stack structure SSa. The plurality of second gate layers DGL3, DGL4, GL3, and GL4 may include the plurality of second dummy gate layers DGL3 and DGL4 on the first stack structure SSa and the plurality of second active gate layers GL3 and GL4 on the plurality of second dummy gate layers DGL3 and DGL4. The plurality of second interlayer insulating layers IL6 to IL9 may separate the plurality of second dummy gate layers DGL3 and DGL4 and the plurality of second active gate layers GL3 and GL4 from each other.

The plurality of second dummy gate layers DGL3 and DGL4 may be included in the plurality of second dummy cells DC3 and DC4 (see FIG. 1), respectively, and may be connected to the plurality of second dummy word lines DWL3 and DWL4 (see FIG. 1), respectively. The plurality of second active gate layers GL3 and GL4 may be included in the plurality of second memory cells MC3 and MC4 (see FIG. 1), respectively, and may be connected to the plurality of second active word lines WL3 and WL4 (see FIG. 1). In some embodiments, the second stack structure SSb may further include an additional second active word line (not shown) on the plurality of second active word lines WL3 and WL4, and the additional second active word line (not shown) may be included in the string select transistor SST, and may be connected to one of the string select lines SSL1 to SSL3 (see FIG. 1). In FIG. 2A, the second stack structure SSb may include two second dummy gate layers DGL3 and DGL4, two second active gate layers GL3 and GL4, and four second interlayer insulating layers IL6 to IL9, but the number of second dummy gate layers, second active gate layers, and second interlayer insulating layers included in the second stack structure SSb is not limited thereto.

The plurality of first active gate layers GL1 and GL2 and the plurality of second active gate layers GL3 and GL4 may include a conductive material, for example, copper (Cu), gold (Au), silver (Ag), aluminum (Al), tungsten (W), titanium (Ti), tantalum (Ta), titanium nitride (TiN), tantalum nitride (TaN), or a combination thereof. The chemical composition of the gate layers of the plurality of first dummy gate layers DGL1 and DGL2 and the plurality of second dummy gate layers DGL3 and DGL4 may be substantially the same as the chemical composition of the plurality of first active gate layers GL1 and GL2 and the plurality of second active gate layers GL3 and GL4. In the present specification, that two objects have the same chemical composition means that a difference in the chemical composition of the two objects is within a chemical composition difference range of the two objects that may occur due to process limitations when the two objects are formed using the same source and process conditions in the same equipment simultaneously. The plurality of first dummy gate layers DGL1 and DGL2 and the plurality of second dummy gate layers DGL3 and DGL4 may include a conductive material including, for example, copper (Cu), gold (Au), silver (Ag), aluminum (Al), tungsten (W), titanium (Ti), tantalum (Ta), titanium nitride (TiN), tantalum nitride (TaN), or a combination thereof. In some embodiments, each of the plurality of first gate layers GL1, GL2, DGL1, and DGL2 and the plurality of second gate layers DGL3, DGL4, GL3, and GL4 may have a thickness of about 10 nanometers (nm) to about 30 nm.

The plurality of first interlayer insulating layers IL1 to IL5 and the plurality of second interlayer insulating layers IL6 to IL9 may include an insulating material including, for example, silicon oxide, silicon nitride, or a combination thereof. In some embodiments, the plurality of first interlayer insulating layers IL1 to IL5 and the plurality of second interlayer insulating layers IL6 to IL9 may be free of (i.e., may not include) nitride. Moreover, each of the plurality of first interlayer insulating layers IL1 to IL5 and the plurality of second interlayer insulating layers IL6 to IL9 may have a thickness of about 10 nm to about 30 nm.

The channel structure 130 may penetrate the first stack structure SSa and the second stack structure SSb. The channel structure 130 may include a first portion 130a penetrating the first stack structure SSa, a second portion 130b penetrating the second stack structure SSb, and a plurality of protrusions 130p1 and 130p2 protruding from side surfaces of the first portion 130a of the channel structure 130. The plurality of protrusions 130p1 and 130p2 of the channel structure 130 may include, for example, a first protrusion 130p1 and a second protrusion 130p2 below the first protrusion 130p1. The second portion 130b of the channel structure 130 may contact the first portion 130a of the channel structure 130.

The first protrusion 130p1 of the channel structure 130 may be located in the upper first interlayer insulating layer IL5. That is, the first protrusion 130p1 of the channel structure 130 may be disposed between the upper first dummy gate layer DGL2 and the lowermost layer DGL3 among the plurality of second gate layers DGL3, DGL4, GL3, and GL4. The second protrusion 130p2 of the channel structure 130 may be located in the lower first interlayer insulating layer IL4. That is, the second protrusion 130p2 of the channel structure 130 may be disposed between the upper first dummy gate layer DGL2 and the lower first dummy gate layer DGL1.

The first portion 130a of the channel structure 130 may be located in a first channel hole CHHa penetrating the first stack structure SSa. The second portion 130b of the channel structure 130 may be located in a second channel hole CHHb penetrating the second stack structure SSb. The first protrusion 130p1 of the channel structure 130 may be located in a first recess CHR1 that is recessed into the uppermost layer IL5 among the plurality of first interlayer insulating layers IL1 to IL5 from the side surface (i.e., side, rather than top or bottom, portion) of the first channel hole CHHa. The second protrusion 130p2 of the channel structure 130 may be located in a second recess CHR2 that is recessed into the second highest layer IL4 among the plurality of first interlayer insulating layers IL1 to IL5 from the side surface of the first channel hole CHHa.

In some embodiments, the first recess CHR1 may be defined by a lower surface of the lowermost layer among the plurality of second gate layers DGL3, DGL4, GL3, and GL4, a side surface of the upper first interlayer insulating layer IL5, and an upper surface of the upper first dummy gate layer DGL2. The second recess CHR2 may be defined by a lower surface of the upper first dummy gate layer DGL2, a side surface of the lower first interlayer insulating layer IL4, and an upper surface of the lower first dummy gate layer DGL1.

In the present specification, the planar area of an object means the area of projection of the object on the X-Y plane. The planar area of a portion 130-2-1 of the channel structure 130 penetrating the upper first interlayer insulating layer IL5 may be greater than the planar area of a portion 130-2-2 of the channel structure 130 penetrating the upper first dummy gate layer DGL2 and the planar area of a portion 130-1-1 of the channel structure 130 penetrating the lowermost layer DGL3 among the plurality of second gate layers DGL3, DGL4, GL3, and GL4. In some embodiments, the planar area of the portion 130-2-2 of the channel structure 130 penetrating the upper first dummy gate layer DGL2 may be greater than the planar area of the portion 130-1-1 of the channel structure 130 penetrating the lowermost layer DGL3 among the plurality of second gate layers DGL3, DGL4, GL3, and GL4. The planar area of a portion 130-2-3 of the channel structure 130 penetrating the lower first interlayer insulating layer IL4 may be greater than the planar area of the portion 130-2-2 of the channel structure 130 penetrating the upper first dummy gate layer DGL2 and the planar area of a portion 130-2-4 of the channel structure 130 penetrating the lower first dummy gate layer DGL1.

The channel structure 130 may include a gate insulating layer 131 in the first channel hole CHHa, the plurality of recesses CHR1 and CHR2, and the second channel hole CHHb, and may include a channel layer 132 on the gate insulating layer 131. In some embodiments, the channel structure 130 may further include a channel filling layer 133 on the channel layer 132. In some embodiments, the channel structure 130 may further include a pad layer 134 blocking an upper end of the second channel hole CHHb.

The gate insulating layer 131 may include a blocking insulating layer 131a in the first channel hole CHHa, the plurality of recesses CHR1 and CHR2 and the second channel hole CHHb, a charge storage layer 131b on the blocking insulating layer 131a, and a tunneling insulating layer 131c on the charge storage layer 131b. The blocking insulating layer 131a may include, for example, silicon oxide, silicon nitride, a metal oxide having a dielectric constant greater than that of silicon oxide, or a combination thereof. The metal oxide may include, for example, hafnium oxide, aluminum oxide, zirconium oxide, tantalum oxide, or a combination thereof. In some embodiments, the blocking insulating layer 131a may have a thickness of about 1 nm to about 10 nm. The charge storage layer 131b may include, for example, silicon nitride, boron nitride, polysilicon, or a combination thereof. In some embodiments, the charge storage layer 131b may have a thickness of about 1 nm to about 10 nm. The tunneling insulation layer 131c may include, for example, metal oxide. In some embodiments, the tunneling insulation layer 131c may have a thickness of about 1 nm to about 10 nm. In some embodiments, each of the blocking insulating layer 131a, the charge storage layer 131b, and the tunneling insulating layer 131c may include oxide, nitride, and oxide.

A part of the gate insulating layer 131 may be located in the plurality of recesses CHR1 and CHR2, and the remaining part of the gate insulating layer 131 may be located outside the plurality of recesses CHR1 and CHR2. In some embodiments shown in FIGS. 2A and 2B, a part of the blocking insulation layer 131a is located in the plurality of recesses CHR1 and CHR2, and the entirety of the tunneling insulation layer 131c may be located outside the plurality of recesses CHR1 and CHR2. The plurality of recesses CHR1 and CHR2 may thus be free of the tunneling insulation layer 131c. However, in other embodiments, a part of the tunneling insulating layer 131c may also be located in the plurality of recesses CHR1 and CHR2. In some embodiments shown in FIGS. 2A and 2B, a part of the charge storage layer 131b may be located in the plurality of recesses CHR1 and CHR2, but in other embodiments, the charge storage layer 131b may be located entirely outside the plurality of recesses CHR1 and CHR2.

In some embodiments shown in FIGS. 2A and 2B, the channel layer 132 may be located outside the plurality of recesses CHR1, CHR2, but in other embodiments, a part of the channel layer 132 may be located in the plurality of recesses CHR1 and CHR2. The channel layer 132 may include a semiconductor material. The channel filling layer 133 may fill a space surrounded by the channel layer 132. The channel filling layer 133 may include, for example, an insulating material. The pad layer 134 may include, for example, a semiconductor material.

The channel layer 132 and the channel filling layer 133 of the channel structure 130 may further penetrate the common source line CSL. The common source line CSL may penetrate the gate insulating layer 131 of the channel structure 130 and contact the channel layer 132 of the channel structure 130. The common source line CSL may include, for example, a semiconductor material. The channel structure 130 may further penetrate the lower etch stop layer 120. The insulating structure 150 may penetrate the second stack structure SSb, the first stack structure SSa, and the lower etch stop layer 120, and a lower end of the insulating structure 150 may extend to the common source line CSL. The insulating structure 150 may be located in a word line cut WLC penetrating the first stack structure SSa and the second stack structure SSb. The insulating structure 150 may include an insulating material.

Figure 3A:
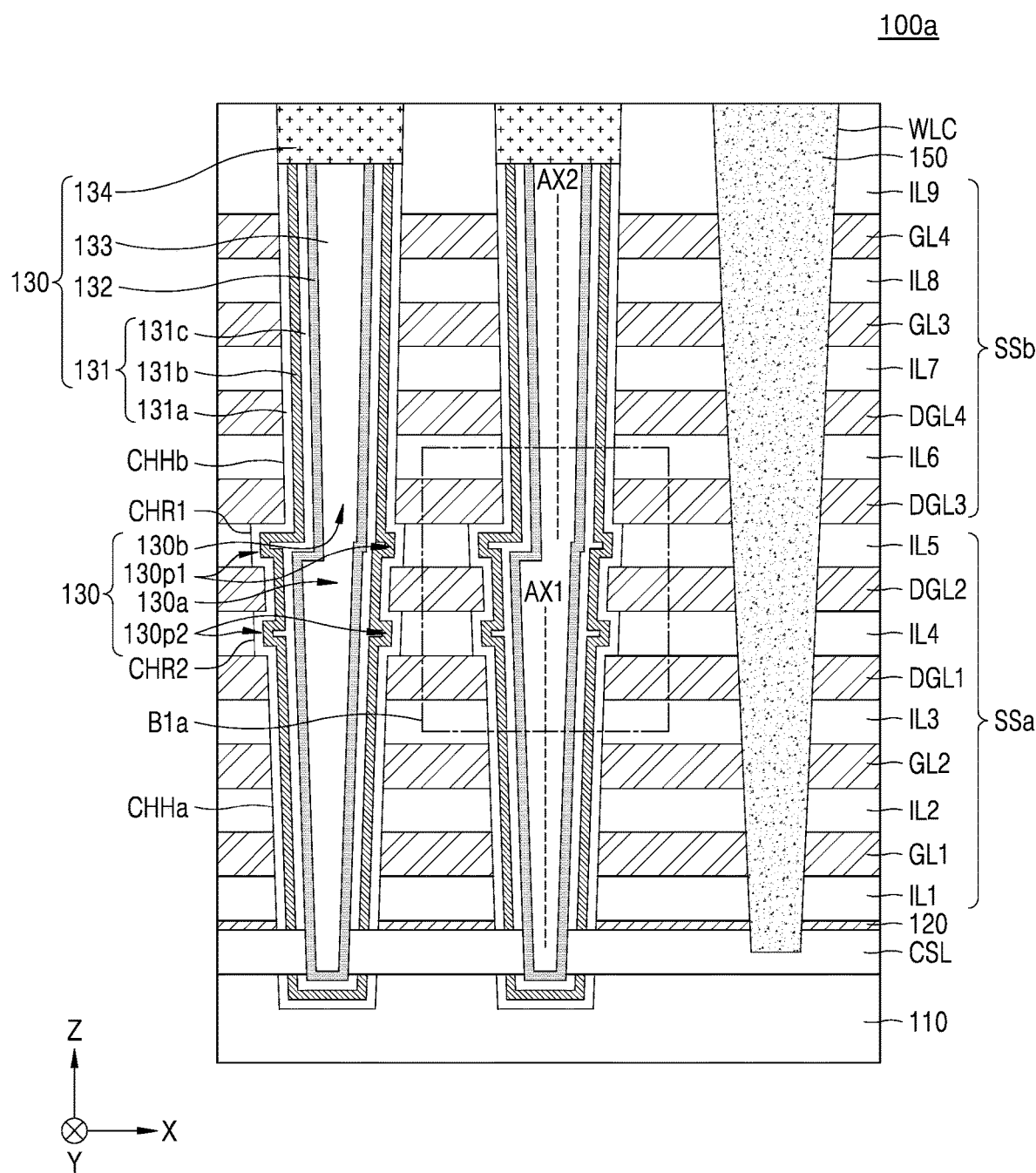
FIG. 3A is a schematic cross-sectional view of a memory device according to an embodiment of the present disclosure.
Figure 3B:
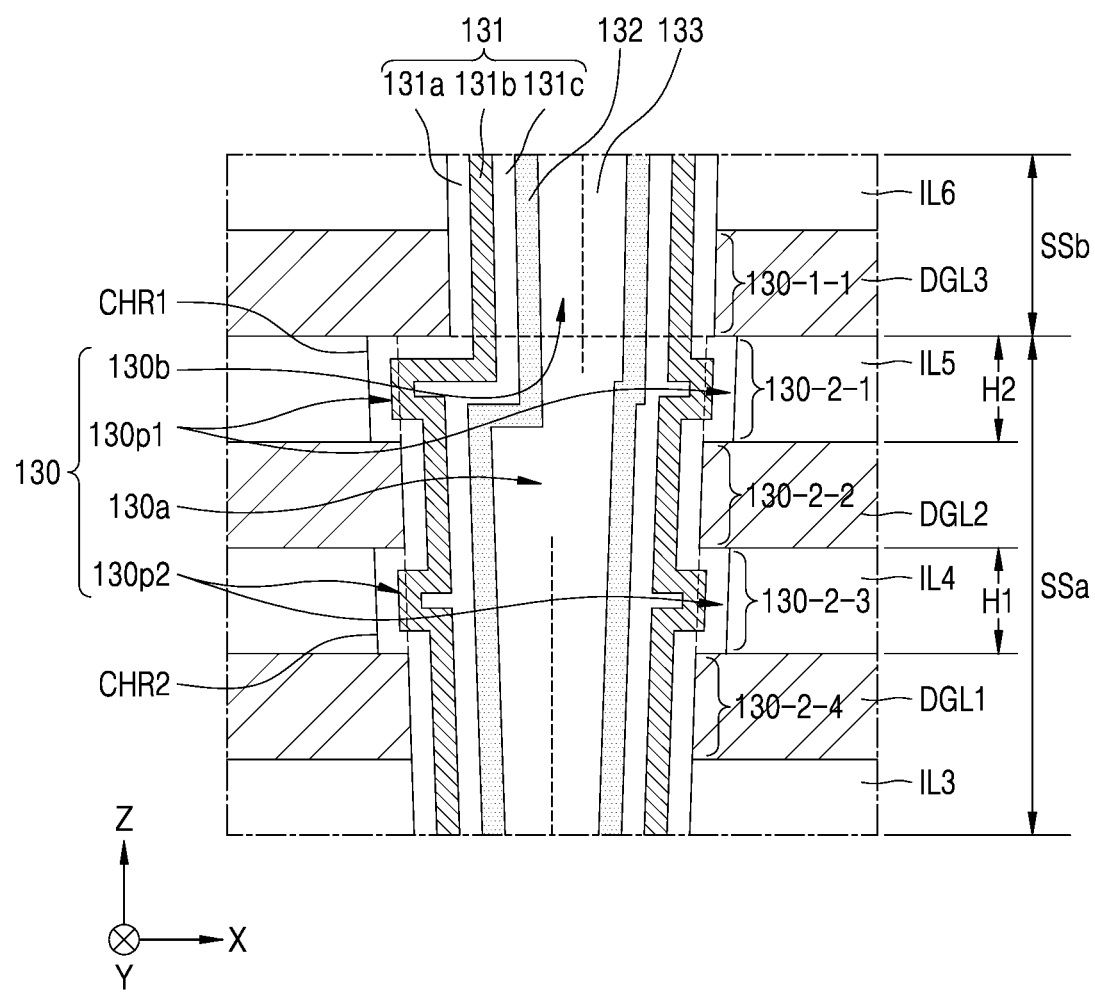
FIG. 3B is an enlarged view of a region B1a of FIG. 3A.

FIG. 3A is a schematic cross-sectional view of a memory device 100a according to an embodiment of the present disclosure. FIG. 3B is an enlarged view of a region B1a of FIG. 3A.

Referring to FIGS. 3A and 3B, a center axis AX1 of the first portion 130a of the channel structure 130 and a center axis AX2 of the second portion 130b of the channel structure 130 may be misaligned. For example, the center axis AX1 of the first portion 130a of the channel structure 130 and the center axis AX2 of the second portion 130b of the channel structure 130 may not be vertically aligned in the Z direction. In some embodiments, due to misalignment, the second portion 130b of the channel structure 130 may be in further contact with not only the first portion 130a of the channel structure 130 but also the first protrusion 130p1 of the channel structure 130.

Figure 4A:
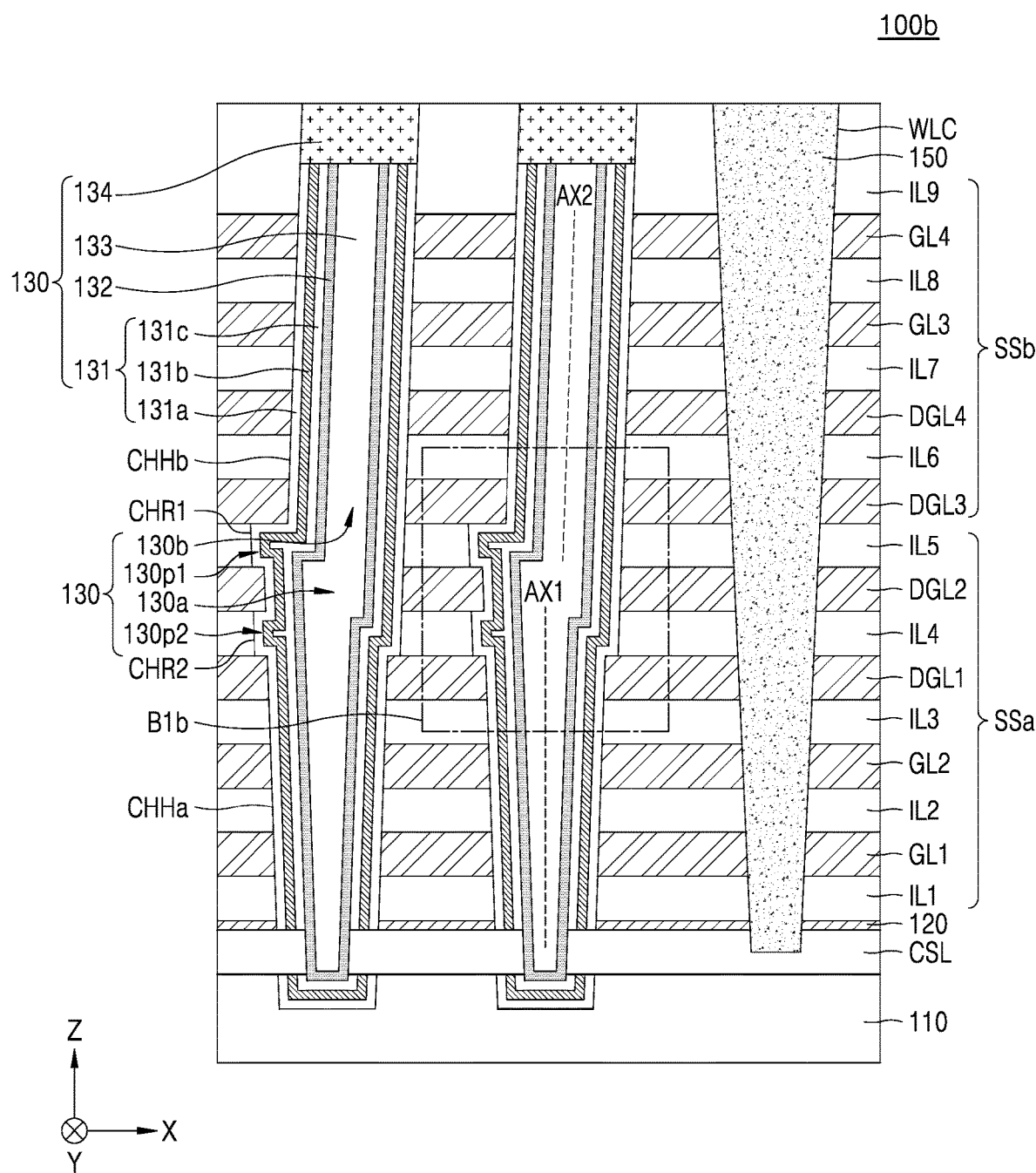
FIG. 4A is a schematic cross-sectional view of a memory device according to an embodiment of the present disclosure.
Figure 4B:
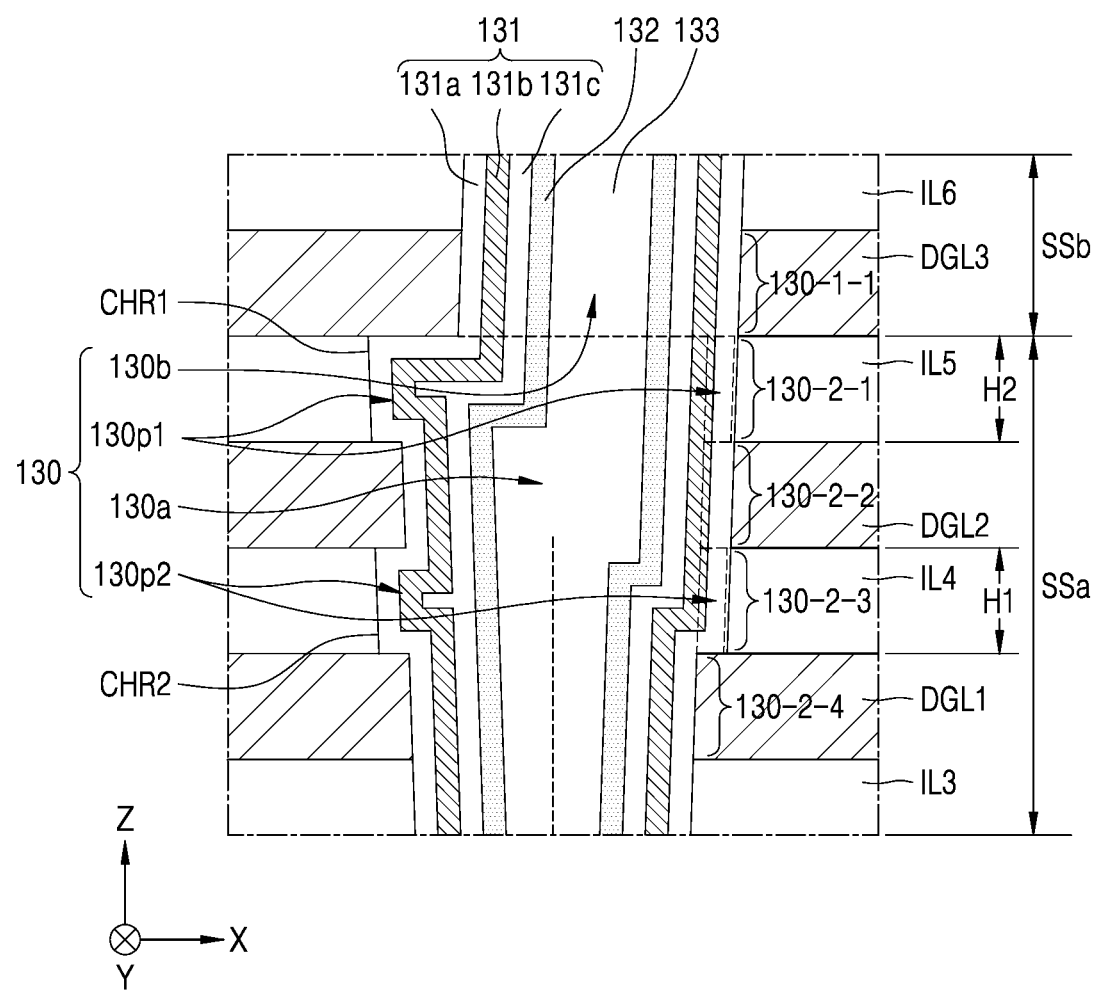
FIG. 4B is an enlarged view of a region B1b of FIG. 4A.

FIG. 4A is a schematic cross-sectional view of a memory device 100b according to an embodiment of the present disclosure. FIG. 4B is an enlarged view of a region B1b of FIG. 4A.

Referring to FIGS. 4A and 4B, the center axis AX1 of the first portion 130a of the channel structure 130 and the center axis AX2 of the second portion 130b of the channel structure 130 may be misaligned. For example, the center axis AX2 of the second portion 130b of the channel structure 130 may not be collinear with the center axis AX1 of the first portion 130a of the channel structure 130. In some embodiments, due to misalignment, the second portion 130b of the channel structure 130 may be in further contact with not only the first portion 130a of the channel structure 130 but also the first protrusions 130p1 and the second protrusion 130p2 of the channel structure 130. The second portion 130b of the channel structure 130 may penetrate the upper first interlayer insulating layer IL5, the upper first dummy gate layer DGL2, and the lower first interlayer insulating layer IL4. In some embodiments, the second portion 130b of the channel structure 130 may further penetrate the lower first dummy gate layer DGL1. However, the second portion 130b of the channel structure 130 may not further penetrate the plurality of first active gate layers GL1 and GL2.

Referring to FIGS. 2A, 2B, 3A, 3B, 4A, and 4B, in the memory devices 100, 100a, and 100b according to an embodiment of the present disclosure, the second portion 130b of the channel structure 130 may not extend too deeply in the first stack structure SSa even if the second portion 130b of the channel structure 130 is misaligned with the first portion 130a of the channel structure 130. Accordingly, the second portion 130b of the channel structure 130 may be inhibited/prevented from penetrating the first active gate layers GL1 and GL2 below the first dummy gate layers DGL1 and DGL2 and failing to exhibit operating characteristics desired by the memory devices 100, 100a and 100b. Accordingly, the memory devices 100, 100a and 100b according to the embodiments of the present disclosure may have an improved process yield. Increasing the number of the recesses CHR2 and CHR1 and increasing the number of the protrusions 130p1 and 130p2 of the channel structure 130 may be particularly effective to inhibit/prevent a decrease in process yield when the rotation axis AX2 of the second portion 130b of the channel structure 130 is not aligned (i.e., collinear) with the rotation axis AX1 of the first portion 130a of the channel structure 130 as in the embodiment shown in FIGS. 4A and 4B.

In addition, even if a height H2 (i.e., a vertical thickness) of the uppermost first interlayer insulating layer IL5 of the first stack structure SSa in the vertical direction (Z direction) is reduced, the second portion 130b of the channel structure 130 may be inhibited/prevented from penetrating the first active gate layers GL1 and GL2 due to misalignment. Therefore, even if the current of the memory devices 100, 100a, and 100b increases and the threshold voltage of the memory devices 100, 100a, and 100b decreases by decreasing the height H2 of the uppermost first interlayer insulating layer IL5 of the first stack structure SSa, the process yield may not be greatly reduced. For example, the height H2 of the uppermost first interlayer insulating layer IL5 of the first stack structure SSa in the vertical direction (Z direction) may be reduced to be substantially the same as (i.e., substantially equal to) the height H1 (i.e., a vertical thickness) of one (e.g., IL4) of the remaining plurality of first interlayer insulating layers IL1 to IL4 in the vertical direction (Z direction). In the present specification, that two objects have substantially the same dimension means that a difference in the dimension of the two objects is designed such that the two objects have the same dimension but is within a dimension difference range of the two objects that may occur due to process limitations. However, in another embodiment, the height H2 of the uppermost first interlayer insulating layer IL5 of the first stack structure SSa in the vertical direction (Z direction) may be greater than the height H1 of one (e.g. IL4) of the remaining plurality of first interlayer insulating layers IL1 to IL4 in the vertical direction (Z direction).

Figure 5:
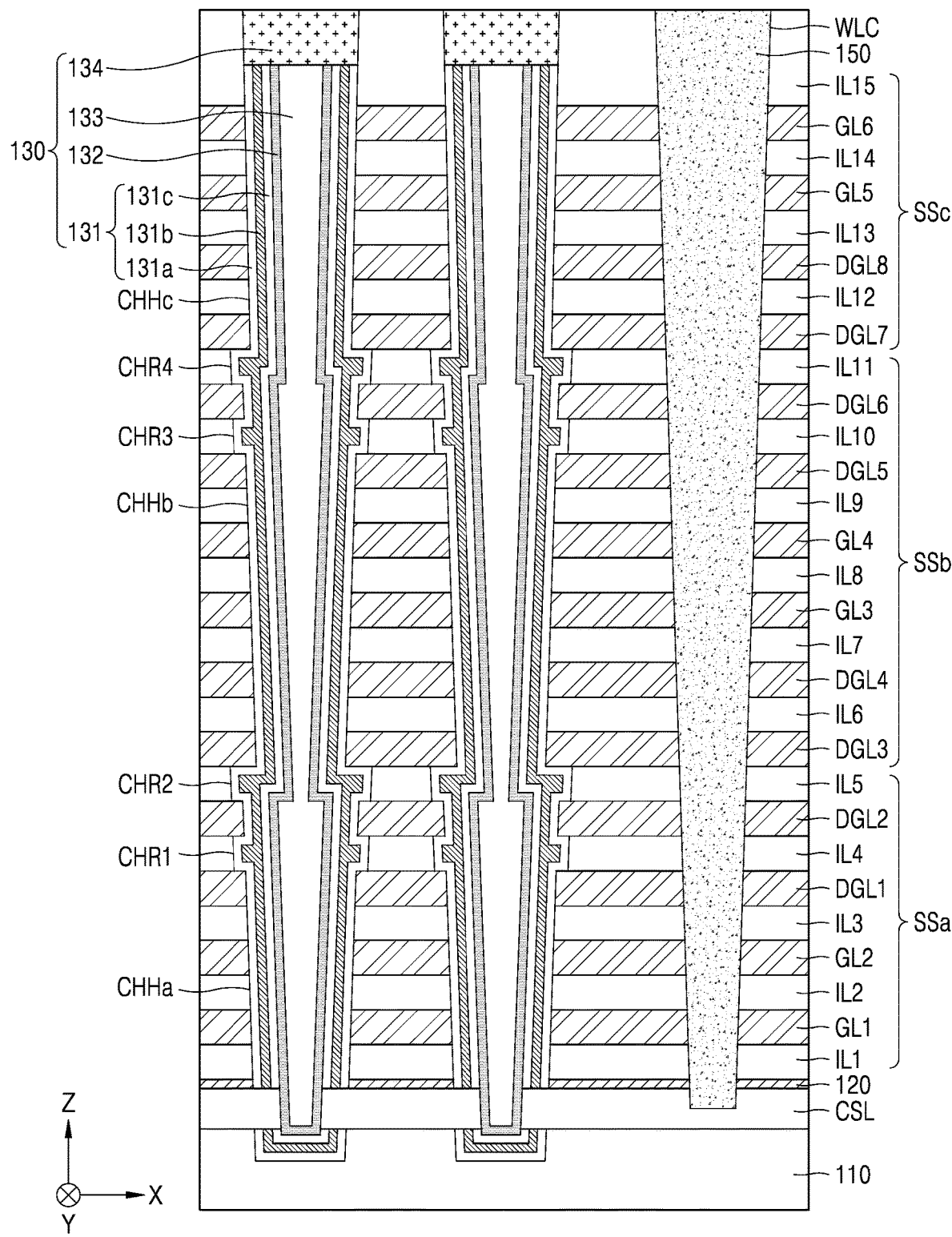
FIG. 5 is a schematic cross-sectional view of a memory device according to an embodiment of the present disclosure.

FIG. 5 is a schematic cross-sectional view of a memory device 100c according to an embodiment of the present disclosure.

Referring to FIG. 5, although the memory device 100 may include the two stack structures SSa and SSb in FIGS. 2A and 2B, the memory device 100c of FIG. 5 may include more than two stack structures SSa, SSb, and SSc. For example, the memory device 100c may include the first to third stack structures SSa, SSb, and SSc. The degree of integration of the memory device 100c may be improved by increasing the number of stack structures (e.g., SSa, SSb, and SSc) stacked on the substrate 110.

The first stack structure SSa may include the plurality of first active gate layers GL1 and GL2 stacked on the substrate 110, the plurality of first dummy gate layers DGL1 and DGL2 stacked on the plurality of first active gate layers GL1 and GL2, and the plurality of first interlayer insulating layers IL1 to IL5 that separate the plurality of first gate layers GL1, GL2, DGL1 and DGL2 from each other. The second stack structure SSb may include the plurality of second dummy gate layers DGL3 and DGL4 stacked on the first stack structure SSa, the plurality of second active gate layers GL3 and GL4 on the plurality of second dummy gate layers DGL3 and DGL4, a plurality of second dummy gate layers DGL5 and DGL6 stacked on the plurality of second active gate layers GL3 and GL4, and the plurality of second interlayer insulating layers IL6 to IL11 that separate the plurality of second gate layers DGL3, DGL4, GL3, GL4, DGL5, and DGL6 from each other. The third stack structure SSc may include a plurality of third dummy gate layers DGL7 and DGL8 stacked on the second stack structure SSb, a plurality of third active gate layers GL5 and GL6 on the plurality of third dummy gate layers DGL7 and DGL8, and a plurality of third interlayer insulating layers IL12 to IL15 that separate the plurality of third gate layers DGL7, DGL8, GL5 and GL6 from each other.

The channel structure 130 of the memory device 100c may penetrate the first to third stack structures SSa, SSb, and SSc. The channel structure 130 may be formed in the first channel hole CHHa penetrating the first stack structure SSa, the second channel hole CHHb penetrating the second stack structure SSb and connected to the first channel hole CHHa, a third channel hole CHHc penetrating through the third stack structure SSc and connected to the second channel hole CHHb, the plurality of recesses CHR1 and CHR2 respectively recessed into the plurality of first interlayer insulating layers IL4 and IL5 from the side surfaces of the first channel hole CHHa, and a plurality of recesses CHR3 and CHR4 respectively recessed into the plurality of second interlayer insulating layers IL10 and IL11 from the side surfaces of the second channel hole CHHb.

Figure 6A:
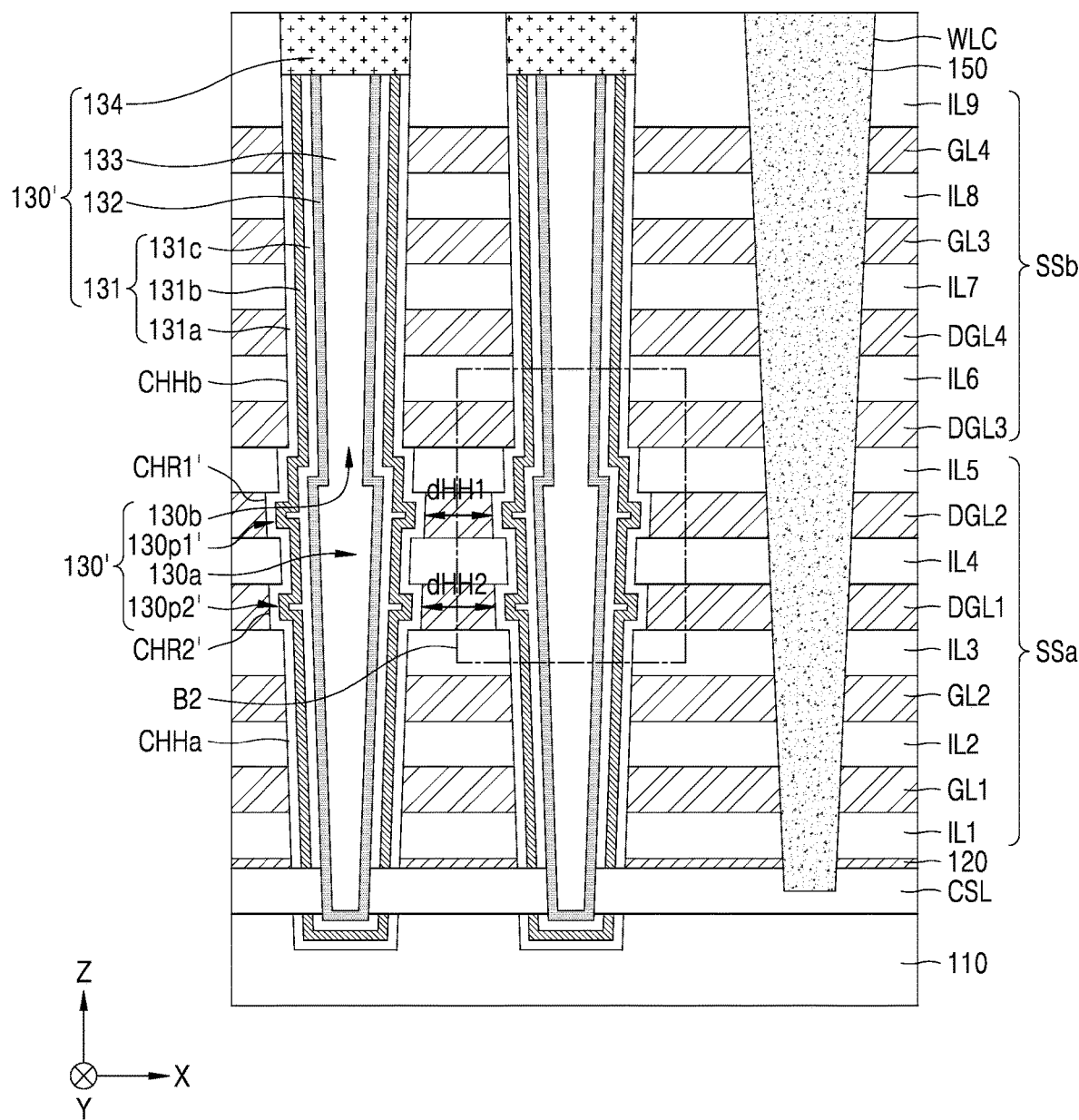
FIG. 6A is a schematic cross-sectional view of a memory device according to an embodiment of the present disclosure.
Figure 6B:
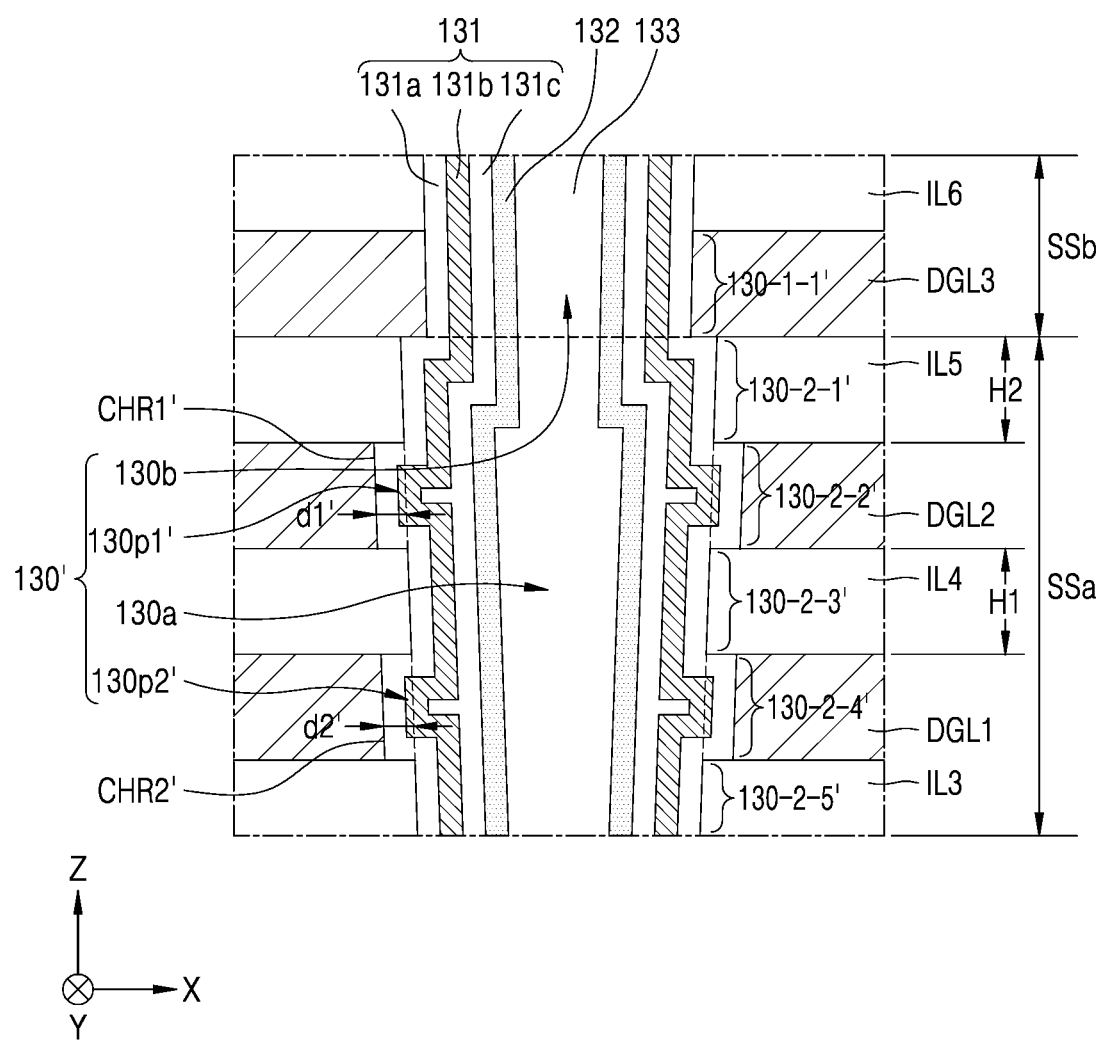
FIG. 6B is an enlarged view of a region B2 of FIG. 6A.

FIG. 6A is a schematic cross-sectional view of a memory device 200 according to an embodiment of the present disclosure. FIG. 6B is an enlarged view of a region B2 of FIG. 6A.

Referring to FIGS. 6A and 6B, a channel structure 130' may include the first portion 130a penetrating the first stack structure SSa, the second portion 130b penetrating the second stack structure SSb, and a plurality of protrusions 130p1' and 130p2' protruding from the side surfaces of the first portion 130a of the channel structure 130. The plurality of protrusions 130p1' and 130p2' of the channel structure 130' may include the first protrusion 130p1' and a second protrusion 130p2' below the first protrusion 130p1'.

The first protrusion 130p1' of the channel structure 130' may be located in the upper first dummy gate layer DGL2. That is, the first protrusion 130p1' of the channel structure 130' may be disposed between the upper first interlayer insulating layer IL5 and the lower first interlayer insulating layer IL4. The second protrusion 130p2' of the channel structure 130' may be located in the lower first dummy gate layer DGL1. That is, the second protrusion 130p2' of the channel structure 130' may be disposed between the lower first interlayer insulating layer IL4 and the third lowest layer IL3 among the plurality of first interlayer insulating layers IL1 to IL5.

The first portion 130a of the channel structure 130' may be located in the first channel hole CHHa penetrating the first stack structure SSa. The second portion 130b of the channel structure 130' may be located in the second channel hole CHHb penetrating the second stack structure SSb. The first protrusion 130p1' of the channel structure 130' may be located in the first recess CHR1' recessed into the upper first dummy gate layer DGL2 from the side surface of the first channel hole CHHa. The second protrusion 130p2' of the channel structure 130' may be located in the second recess CHR2' recessed into the lower first dummy gate layer DGL1 from the side surface of the first channel hole CHHa.

In some embodiments, the first recess CHR1' may be defined by a lower surface of the upper first interlayer insulating layer IL5, a side surface of the upper first dummy gate layer DGL2, and an upper surface of the lower first interlayer insulating layer IL4. The second recess CHR2' may be defined by a lower surface of the lower first interlayer insulating layer IL4, a side surface of the lower first dummy gate layer DGL1, and an upper surface of a third highest layer IL3 among the plurality of first interlayer insulating layers IL1 to IL5.

The planar area of a portion 130-2-2' of the channel structure 130' penetrating the upper first dummy gate layer DGL2 may be greater than the planar area of a portion 130-2-1' of the channel structure 130' penetrating the upper first interlayer insulating layer IL5 and the planar area of a portion 130-2-3' of the channel structure 130' penetrating the lower first interlayer insulating layer IL4. In some embodiments, the planar area of the portion 130-1-1' of the channel structure 130' penetrating the lowermost layer DGL3 among the plurality of second gate layers DGL3, DGL4, GL3, and GL4 may be less than the planar area of the portion 130-2-1' of the channel structure 130' penetrating the upper first interlayer insulating layer IL5. The planar area of a portion 130-2-4' of the channel structure 130' penetrating the lower first dummy gate layer DGL1 may be larger than the planar area of the portion 130-2-3' of the channel structure 130' penetrating the lower first interlayer insulating layer IL4 and the planar area of a portion 130-2-5' of the channel structure 130' penetrating the third highest layer IL3 among the plurality of first interlayer insulating layers IL1 to IL5.

Figure 7:
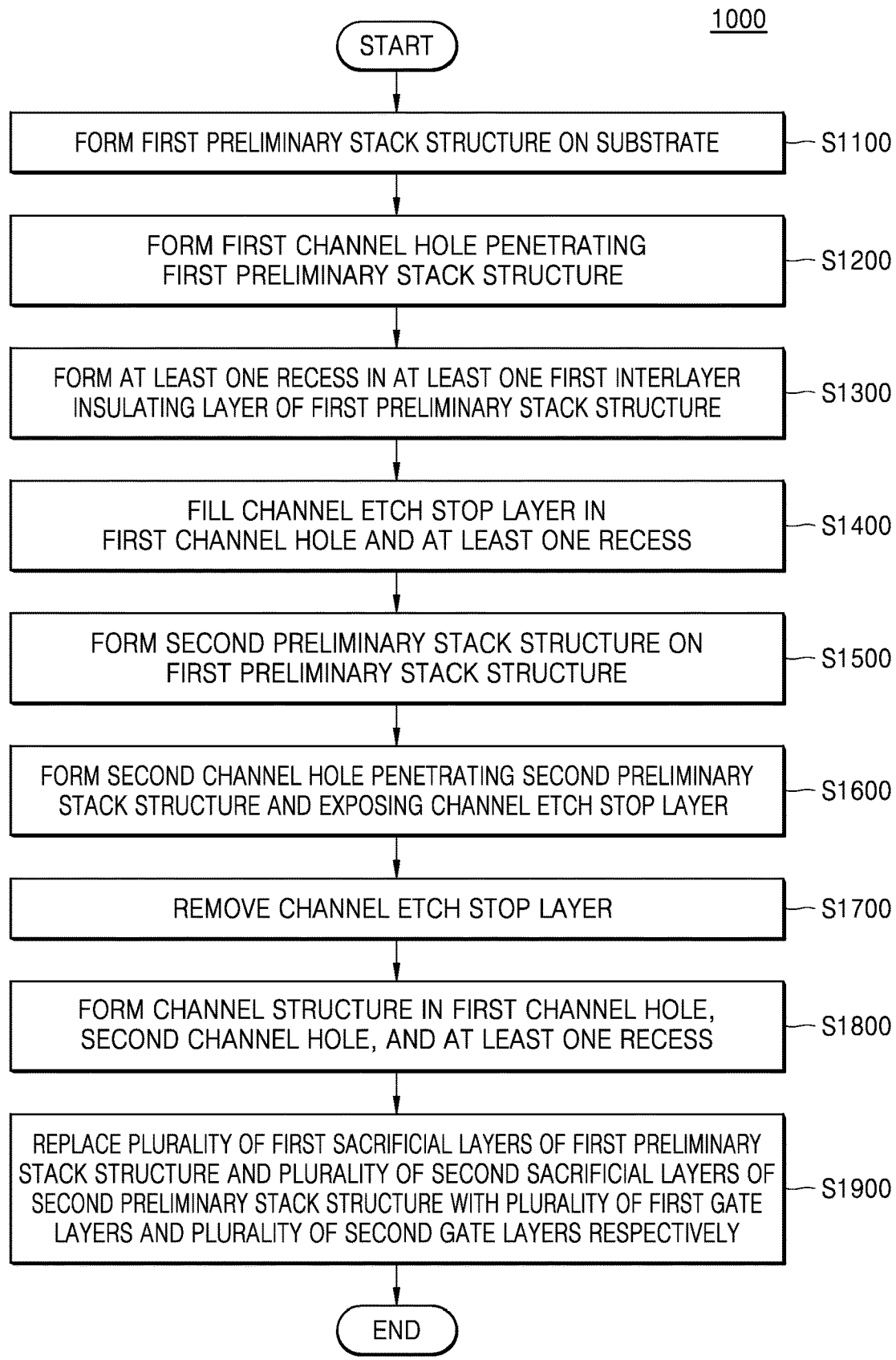
FIG. 7 is a flowchart schematically illustrating a method of manufacturing a memory device according to an embodiment of the present disclosure.
Figure 8A:
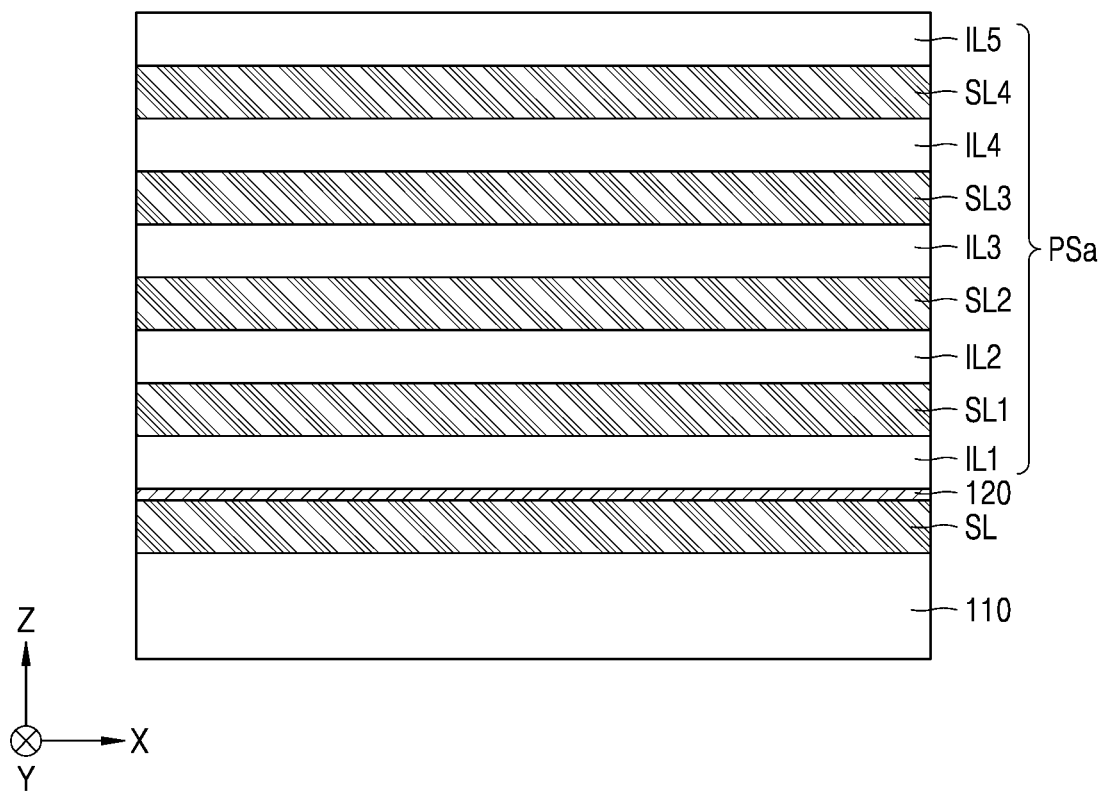
FIGS. 8A through 8P and 9 are schematic cross-sectional views illustrating a method of manufacturing a memory device according to an embodiment of the present disclosure.
Figure 8P:
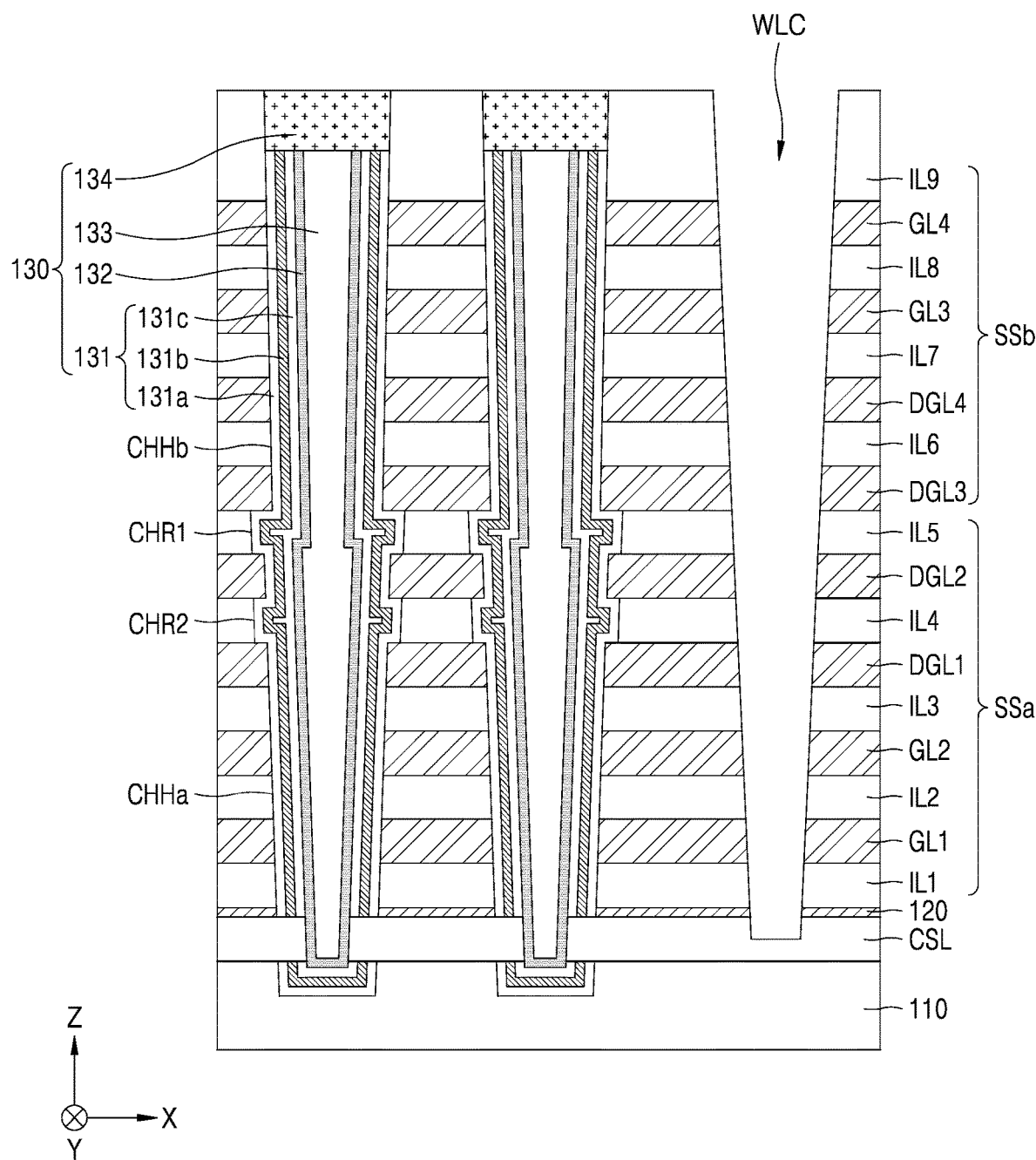
Figure 9:
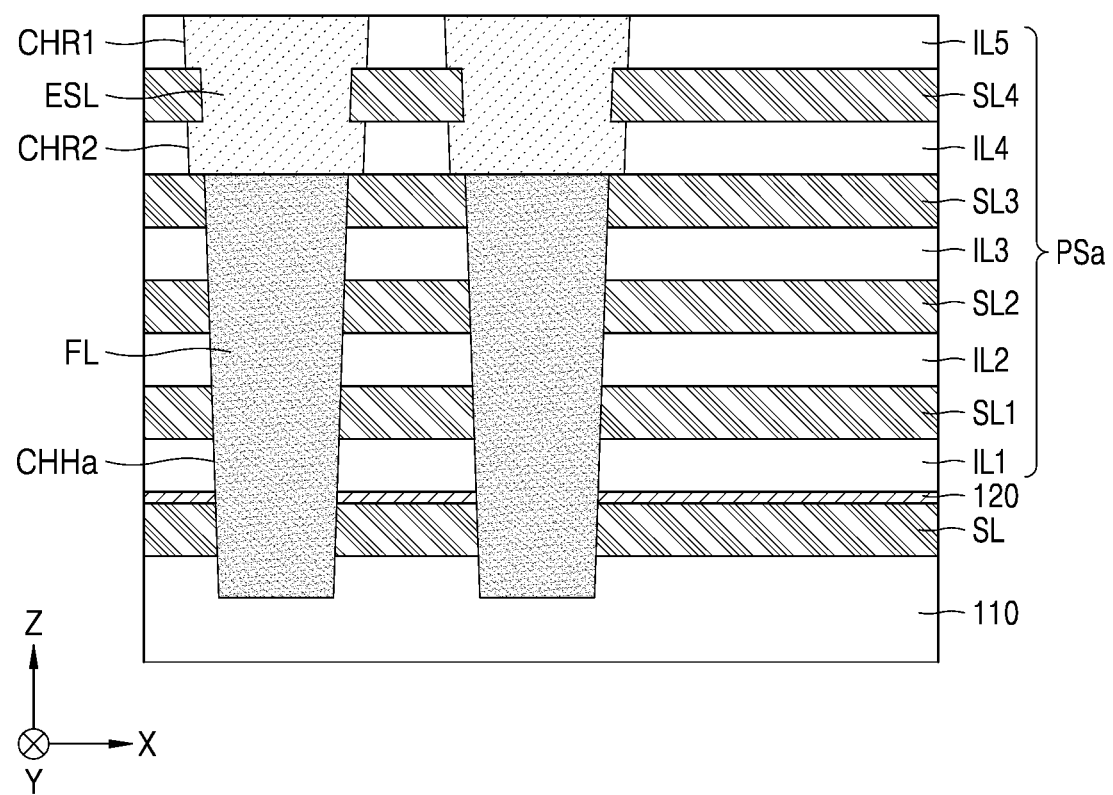

FIG. 7 is a flowchart schematically illustrating a method 1000 of manufacturing a memory device according to an embodiment of the present disclosure. FIGS. 8A through 8P and 9 are schematic cross-sectional views illustrating the method 1000 of manufacturing a memory device according to an embodiment of the present disclosure.

Referring to FIGS. 7 and 8A, a first preliminary stack structure PSa may be formed on the substrate 110 (S1100). The first preliminary stack structure PSa may include a plurality of first sacrificial layers SL1 to SL4 and the plurality of first interlayer insulating layers IL1 to IL5 alternately stacked on the substrate 110. That is, the first preliminary stack structure PSa may be formed by alternately forming the plurality of first sacrificial layers SL1 to SL4 and the plurality of first interlayer insulating layers IL1 to IL5 on the substrate 110. In some embodiments, the method 1000 of manufacturing the memory device may further sequentially form the lower sacrificial layer SL and the lower etch stop layer 120 on the substrate 110 before forming the first preliminary stack structure PSa (S1100). The plurality of first sacrificial layers SL1 to SL4 and the lower sacrificial layer SL may include any material, for example, silicon nitride, having an etch selectivity with respect to the plurality of first interlayer insulating layers IL1 to IL5. The lower etch stop layer 120 may include any material, for example polysilicon, having an etch selectivity with respect to the lower sacrificial layer SL.

Figure 8B:
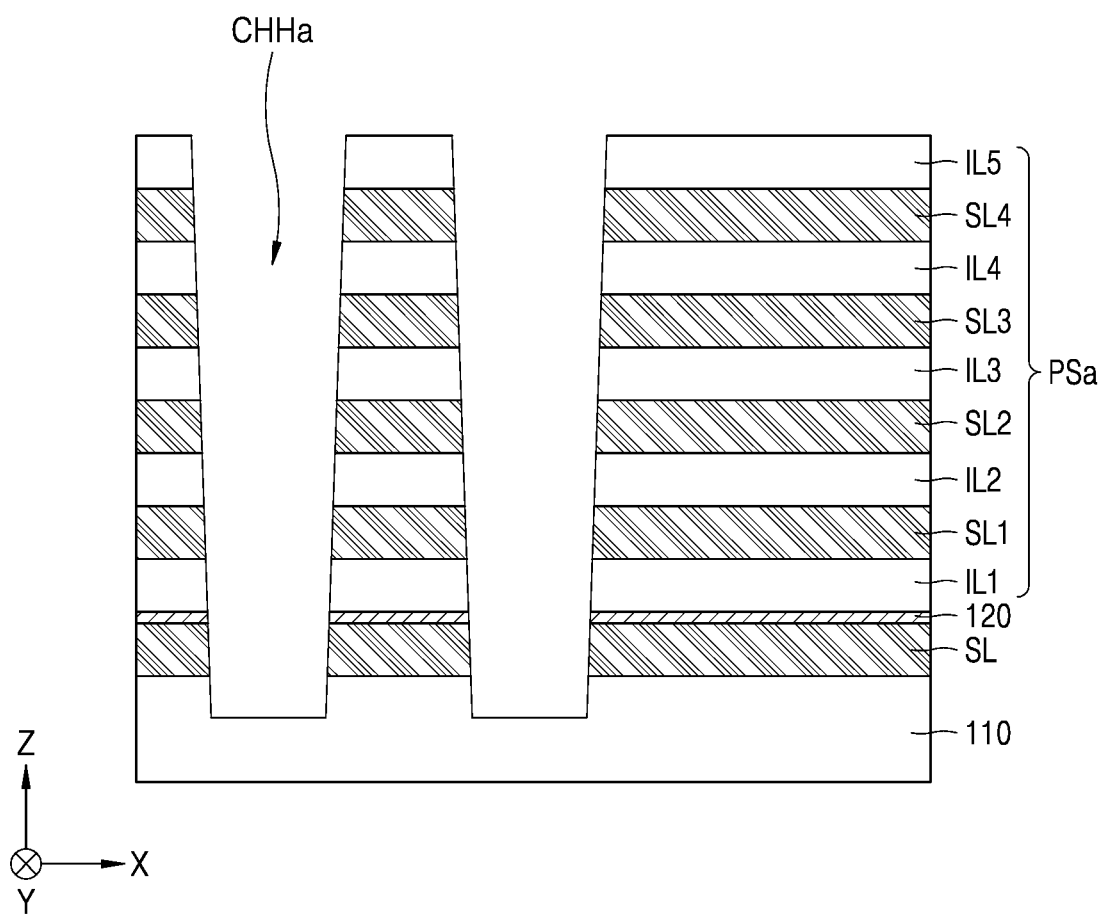

Referring to FIGS. 7 and 8B, the first channel hole CHHa penetrating the first preliminary stack structure PSa may be formed (S1200). In some embodiments, the first channel hole CHHa may further penetrate the lower etch stop layer 120 and the lower sacrificial layer SL.

Figure 8C:
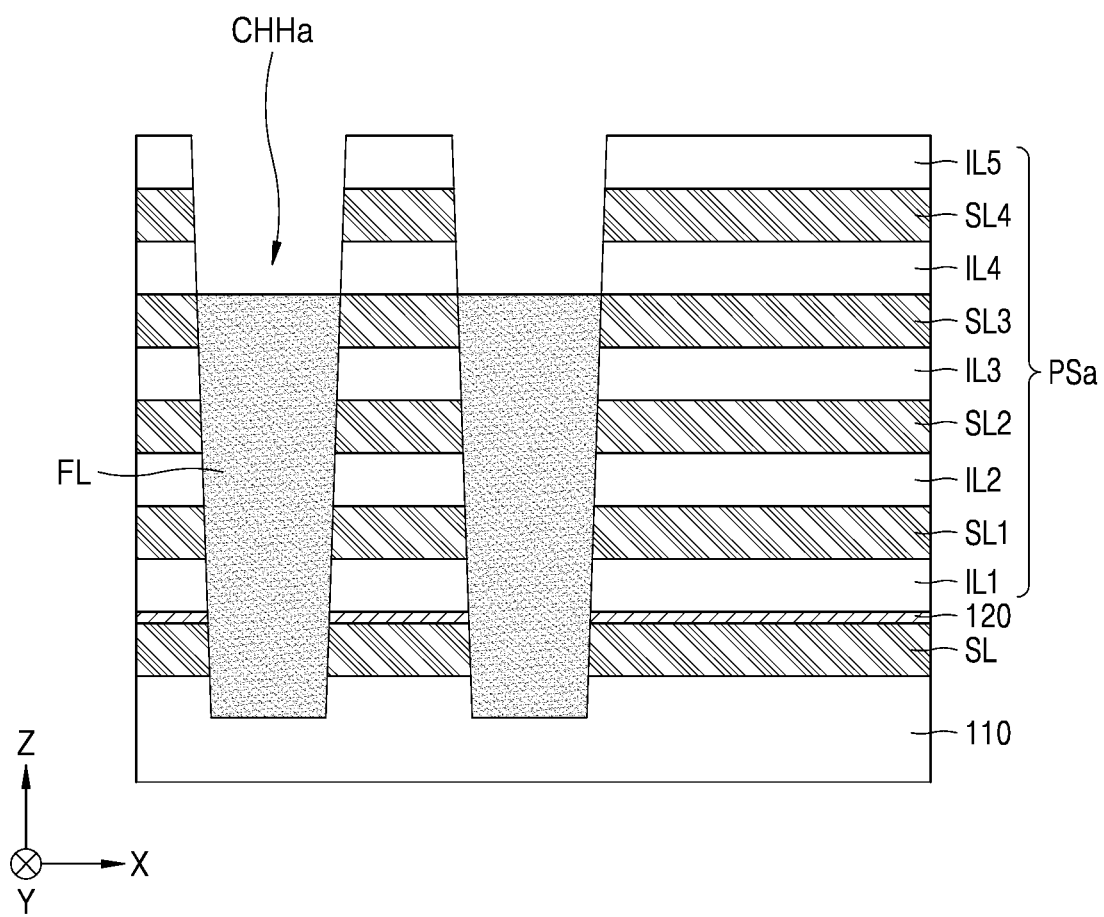

Referring to FIG. 8C, a sacrificial filling layer FL that exposes sidewalls of at least one (e.g., the upper first interlayer insulating layer IL5 and the lower first interlayer insulating layer IL4) of the plurality of first interlayer insulating layers IL1 to IL5 to the first channel hole CHHa and covers the remaining ones (e.g., IL1 to IL3) of the plurality of first interlayer insulating layers IL1 to IL5 may be formed in the first channel hole CHHa. Specifically, the sacrificial filling layer FL is filled in the first channel hole CHHa, and the upper portion of the sacrificial filling layer FL may be removed such that at least one (e.g., IL4 and IL5) of the plurality of first interlayer insulating layers IL1 to IL5 is exposed to the first channel hole CHHa by the sacrificial filling layer FL. The sacrificial filling layer FL may include any material having an etch selectivity with respect to the plurality of first interlayer insulating layers IL1 to IL5 and the plurality of first sacrificial layers SL1 to SL4, such as a spin-on-hard mask, polysilicon, metal, or a combination thereof.

Figure 8D:
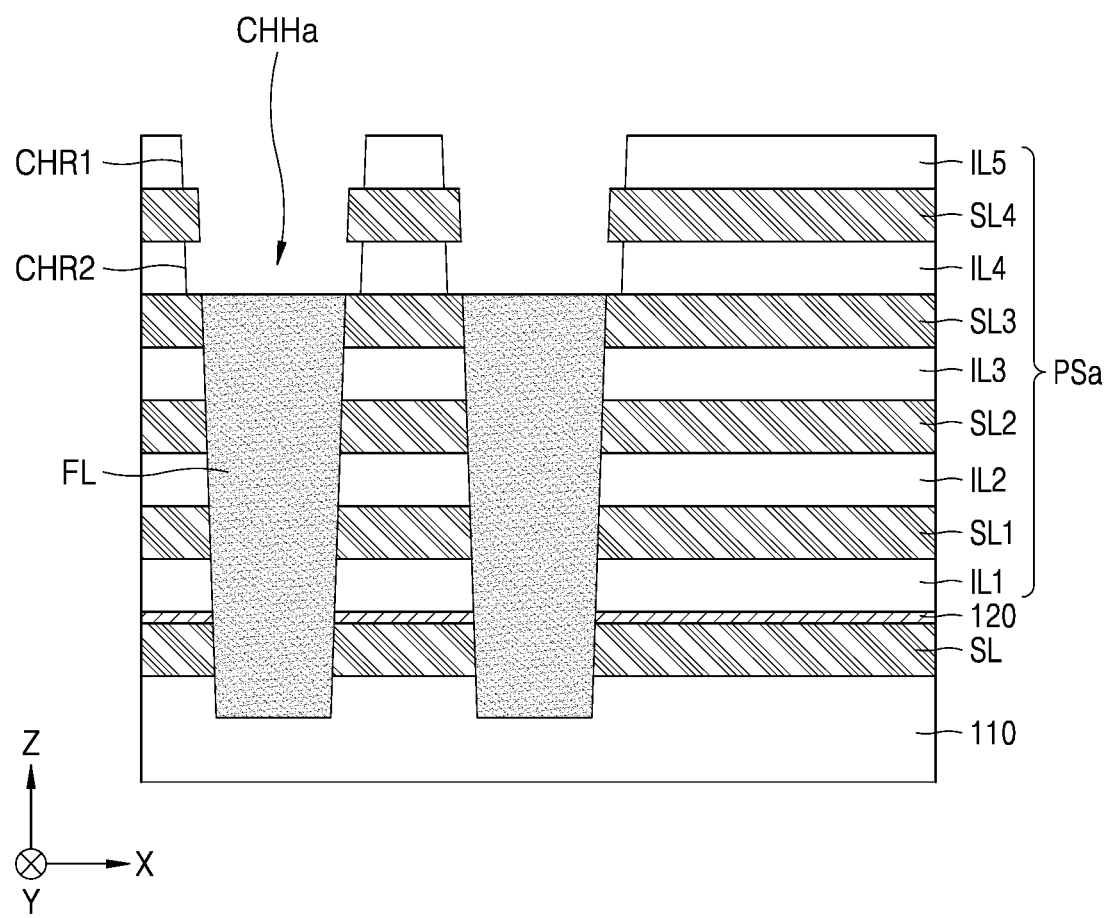
Figure 8E:
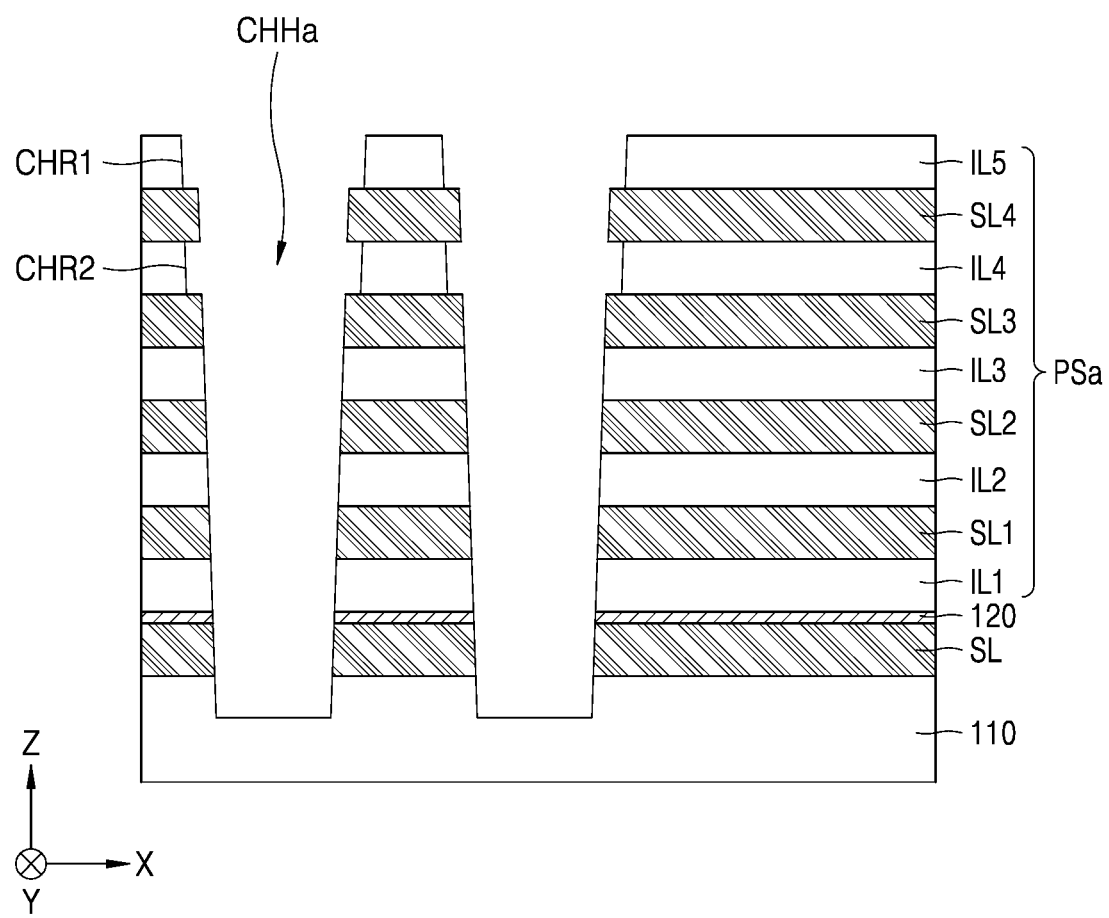

Referring to FIGS. 7, 8D, and 8E, at least one recess (e.g., CHR1 and CHR2) that is recessed into at least one first interlayer insulating layer (e.g., IL4 and IL5) that is exposed by the sacrificial filling layer FL from the side surface of the first channel hole CHHa may be formed (S1300). Specifically, the first recess CHR1 in the upper first interlayer insulating layer IL5 and the second recess CHR2 in the lower first interlayer insulating layer IL4 may be formed by removing, for example, horizontally etching, a portion exposed to the first channel hole CHHa of the upper first interlayer insulating layer IL5 and the lower first interlayer insulating layer IL4. To selectively etch the first interlayer insulating layers IL5 and IL4, an etchant having a higher etching rate with respect to a material constituting the first interlayer insulating layers IL5 and IL4 than an etching rate with respect to a material constituting the lower first sacrificial layer SL4 may be used. The sacrificial filling layer FL may be removed after the at least one recess CHR1 and CHR2 is formed.

Figure 8F:
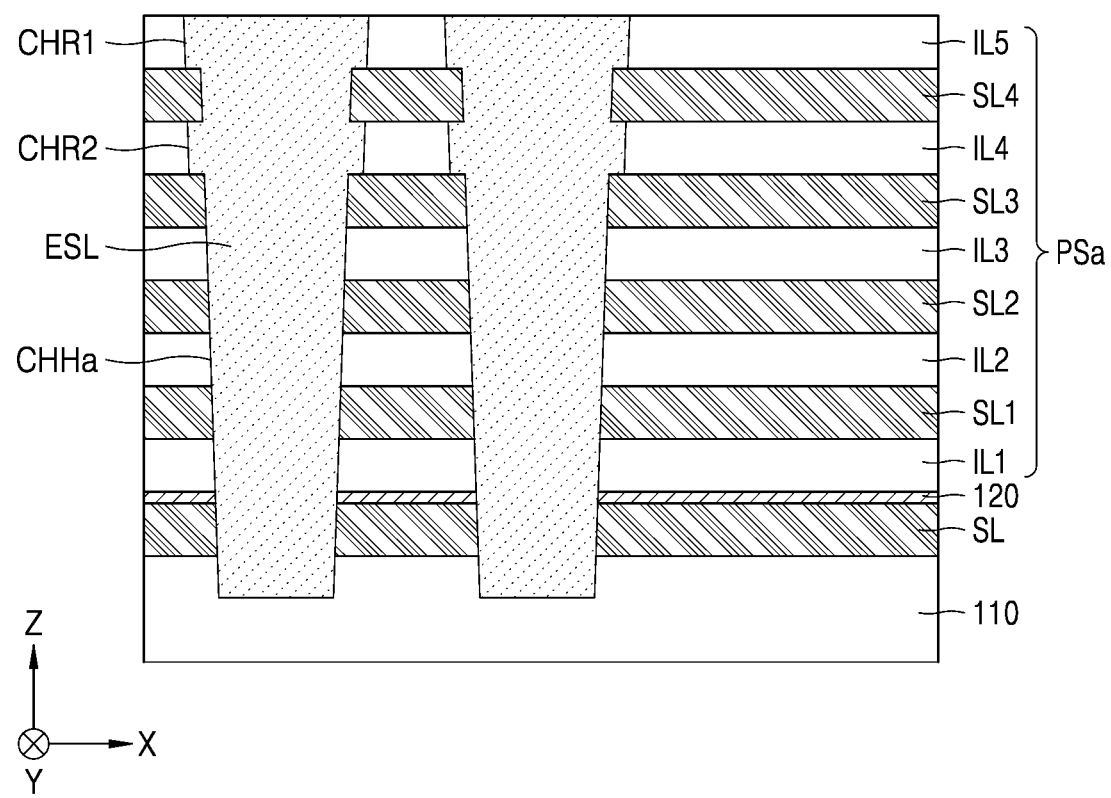

Referring to FIGS. 7 and 8F, a channel etch stop layer ESL may be filled in the first channel hole CHHa and at least one recess (e.g., CHR1 and CHR2) (S1400). The channel etch stop layer ESL may include any material having an etch selectivity with respect to the plurality of first interlayer insulating layers IL1 to IL5 and the plurality of first sacrificial layers SL1 to SL4, such as a spin-on-hard mask, polysilicon, metal, or a combination thereof.

In some embodiments, unlike what is shown in FIGS. 8D to 8F, the channel etch stop layer ESL may be formed on the sacrificial filling layer FL as shown in FIG. 9 without removing the sacrificial fill layer FL after forming at least one recess CHR1 and CHR2. In such some embodiments, the sacrificial filling layer FL and the channel etch stop layer ESL may include substantially the same material. In another embodiment, the sacrificial filling layer FL and the channel etch stop layer ESL may include different materials.

Figure 8G:
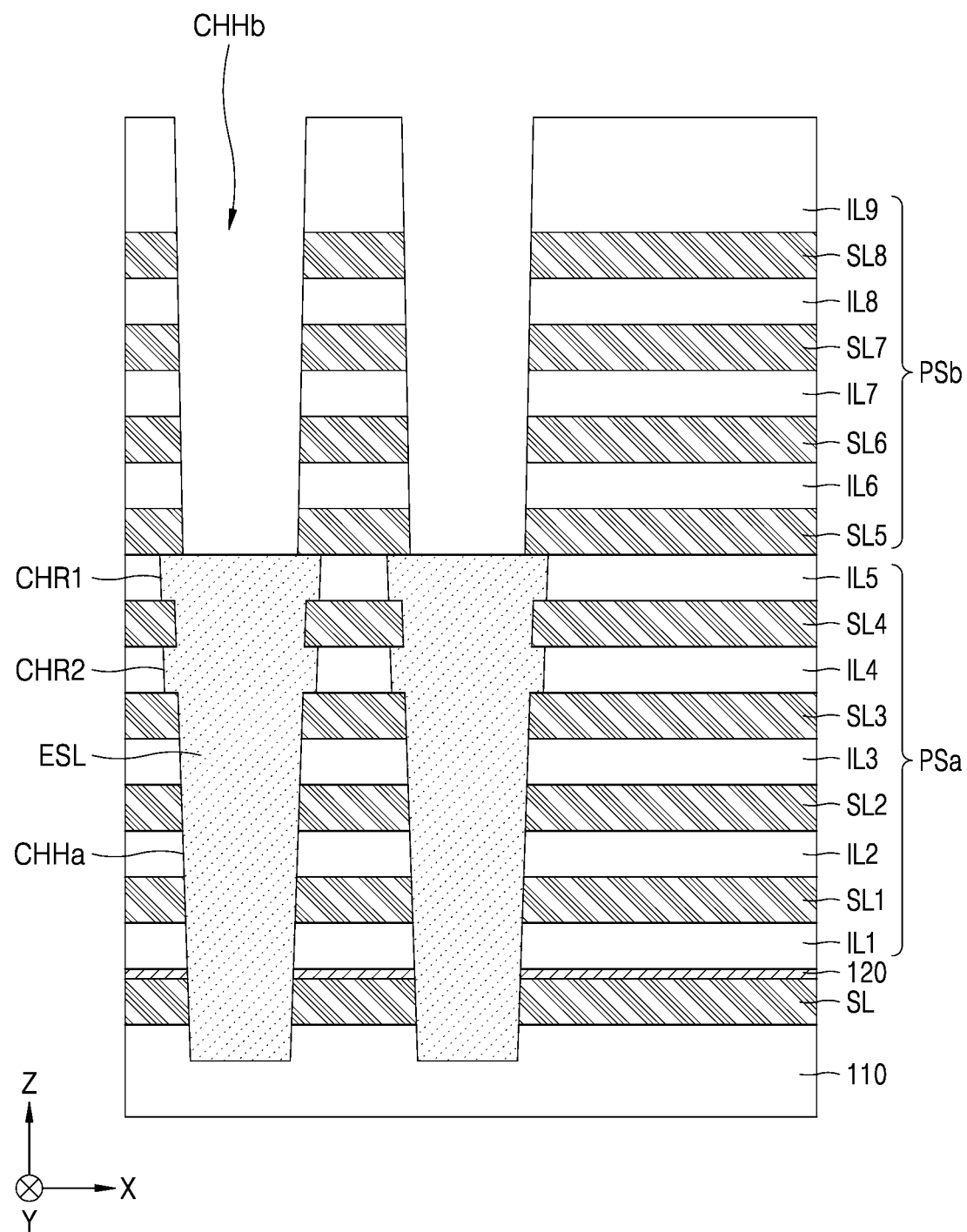
Figure 8H:
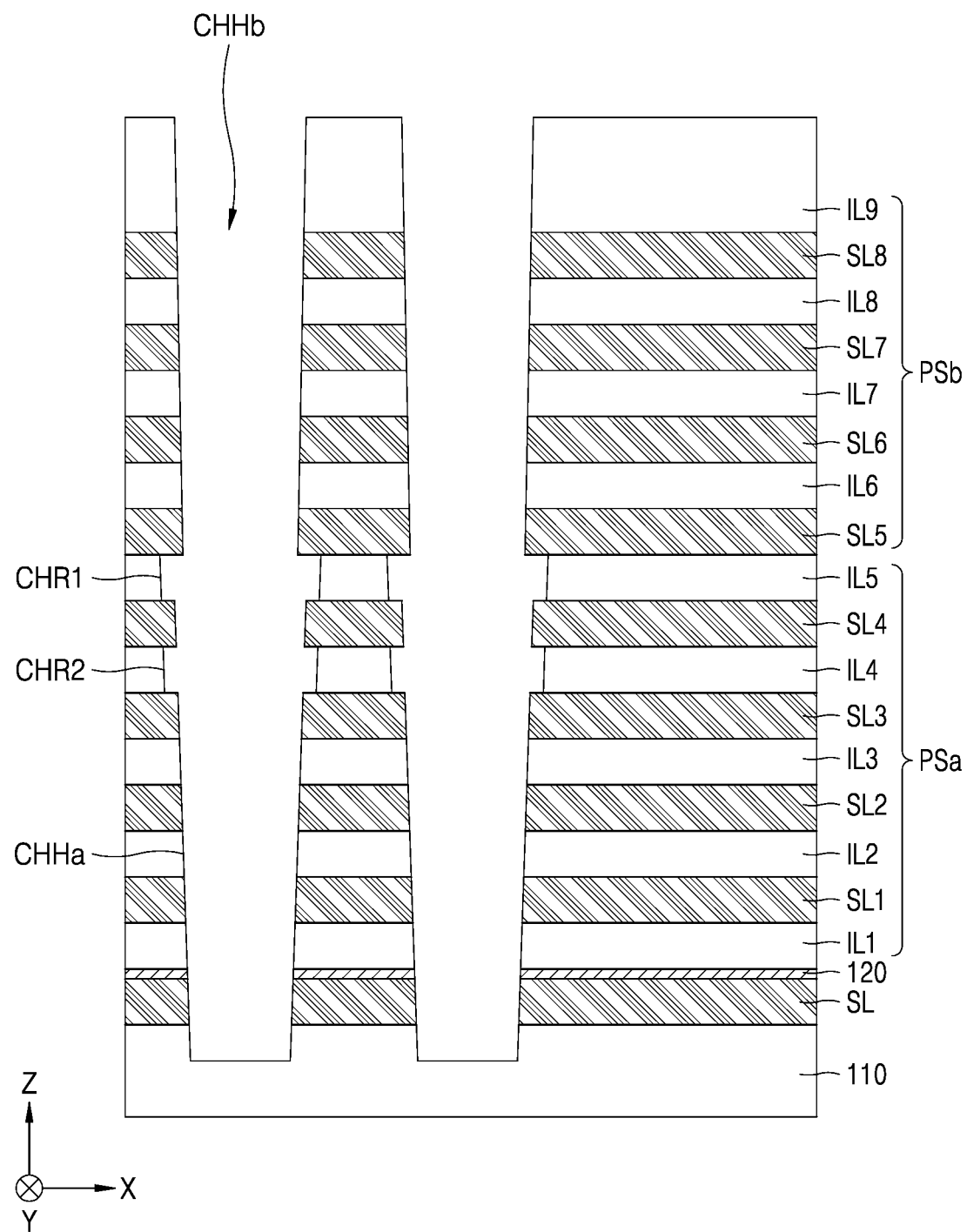

Referring to FIGS. 7, 8G, and 8H, a second preliminary stack structure PSb may be formed on the first preliminary stack structure PSa (S1500). The second preliminary stack structure PSb may include a plurality of second sacrificial layers SL5 to SL8 and a plurality of second interlayer insulating layers IL6 to IL9 that are alternately stacked on the first preliminary stack structure PSa. That is, the second preliminary stack structure PSb may be formed by alternately forming the plurality of second sacrificial layers SL5 to SL8 and the plurality of second interlayer insulating layers IL6 to IL9 on the first preliminary stack structure PSa. The plurality of second sacrificial layers SL5 to SL8 may include any material, for example, silicon nitride, having an etch selectivity with respect to the plurality of first interlayer insulating layers IL1 to IL5.

Next, the second channel hole CHHb penetrating the second preliminary stack structure PSb and exposing a portion of a top surface of the channel etch stop layer ESL may be formed (S1600). When etching the second channel hole CHHb (S1600), the channel etch stop layer ESL may inhibit/prevent the second channel hole CHHb from being too deeply etched into the first preliminary stack structure PSa. Forming at least one recess CHR1 and CHR2 may increase the planar area of the channel etch stop layer ESL, thereby increasing the allowable misalignment range between the first channel hole CHHa and the second channel hole CHHb. Accordingly, the process yield of operation (S1600) of forming the second channel hole CHHb may be improved by forming the at least one recess CHR1 and CHR2. In addition, even if the thickness of the upper first interlayer insulating layer IL5 is reduced to improve device characteristics, because the second channel hole CHHb may be inhibited/prevented from being etched too deeply into the first preliminary stack structure PSa, a process yield reduction may be inhibited/prevented. After forming the second channel hole CHHb, the channel etch stop layer ESL may be removed (S1700).

Figure 8I:
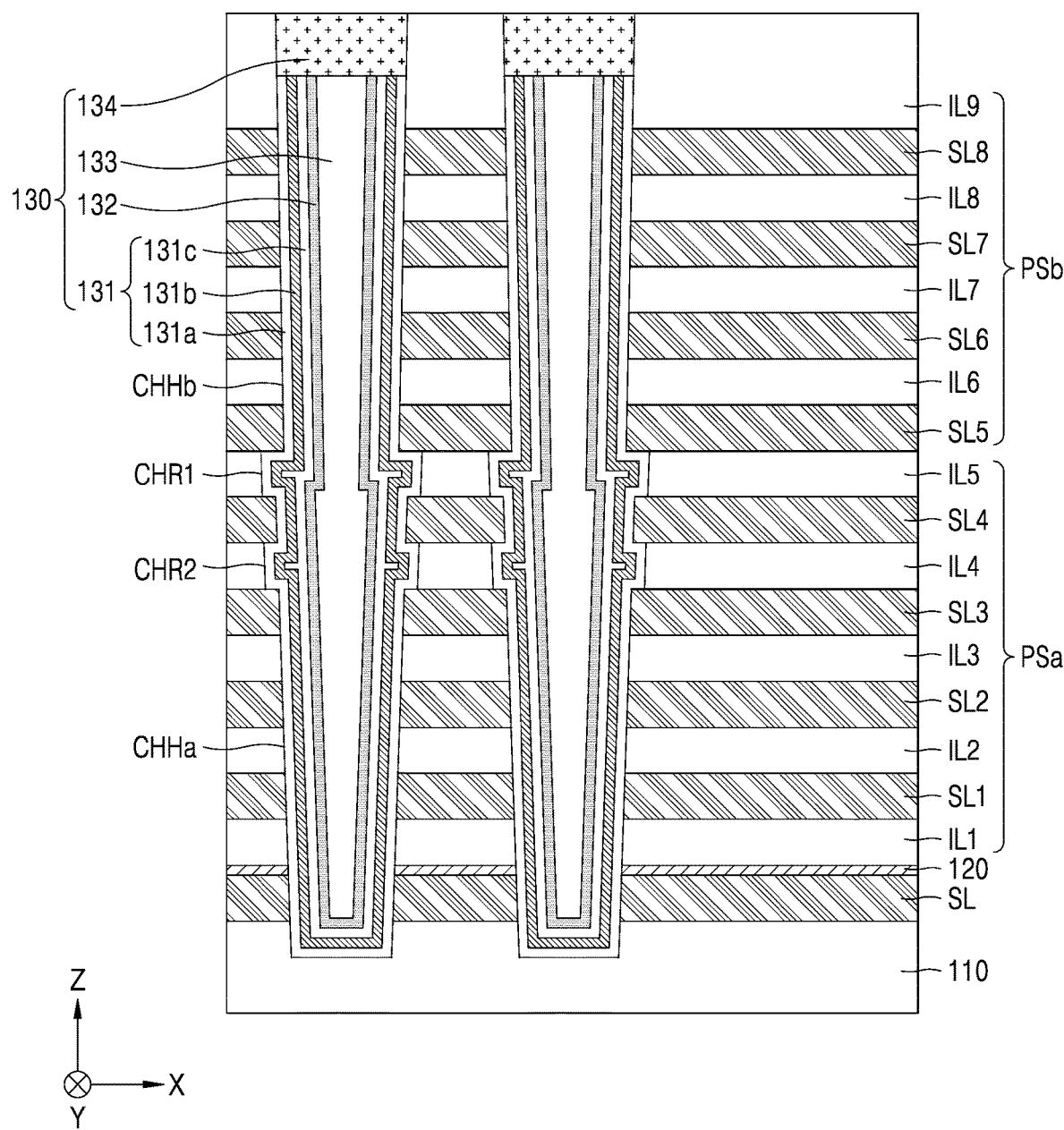

Referring to FIGS. 7 and 8I, the channel structure 130 may be formed in the first channel hole CHHa, the second channel hole CHHb, and the at least one recess CHR1 and CHR2 (S1800). Specifically, the gate insulating layer 131 and the channel layer 132 may be sequentially formed in/on the first channel hole CHHa, the at least one recess CHR1 and CHR2, and the second channel hole CHHb. Specifically, the gate insulating layer 131 may be formed by sequentially forming the blocking insulating layer 131a, the charge storage layer 131b, and the tunneling insulating layer 131c in the first channel hole CHHa, the at least one recess CHR1 and CHR2, and the second channel hole CHHb. In some embodiments, the channel filling layer 133 may be further formed on the channel layer 132. Thereafter, a pad layer 134 blocking the upper end of the second channel hole CHHb may be further formed.

Figure 8J:
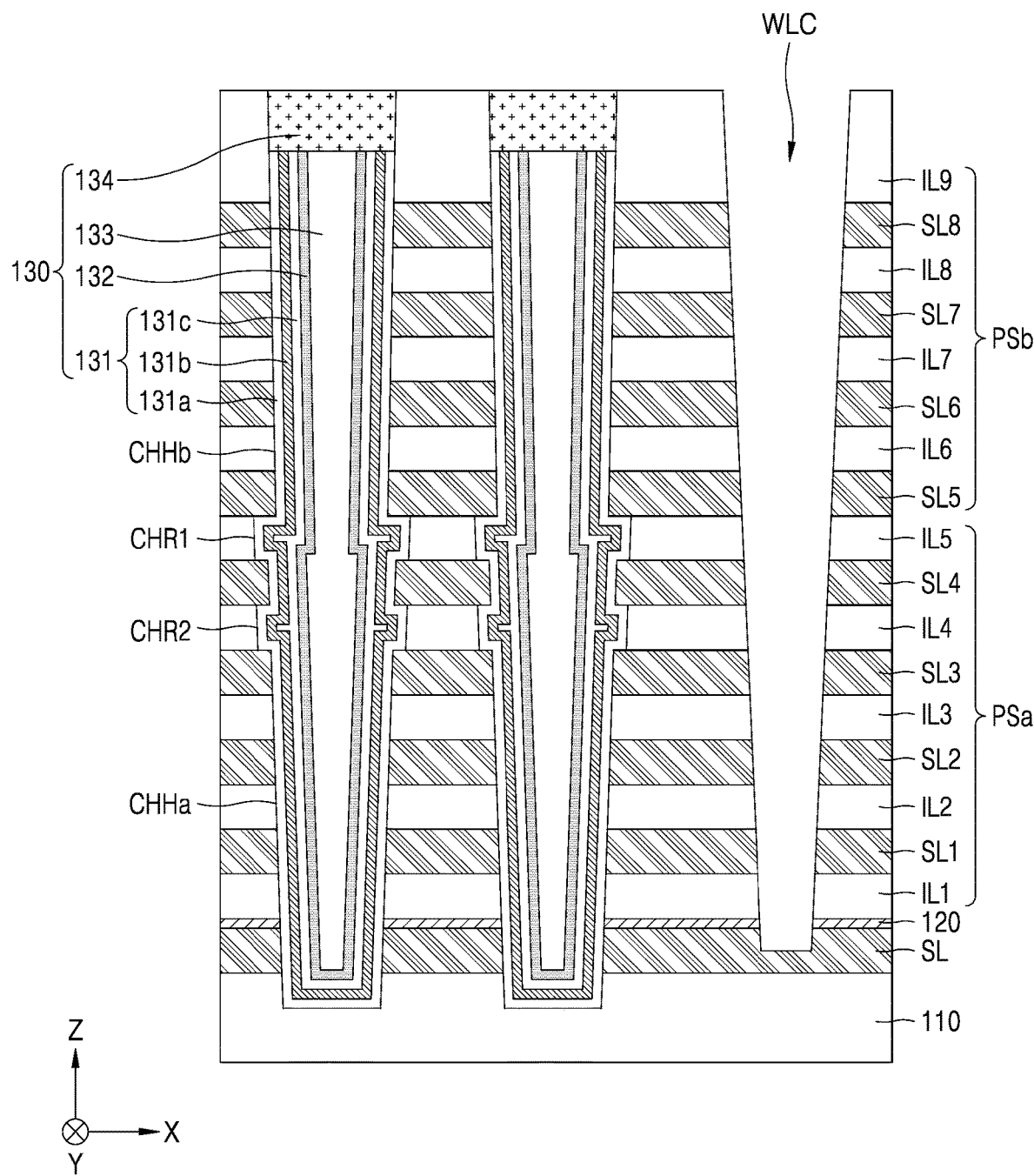

Referring to FIG. 8J, the word line cut WLC penetrating the first preliminary stack structure PSa, the second preliminary stack structure PSb, and the lower etch stop layer 120 may be formed. The word line cut WLC may expose the lower sacrificial layer SL.

Figure 8K:
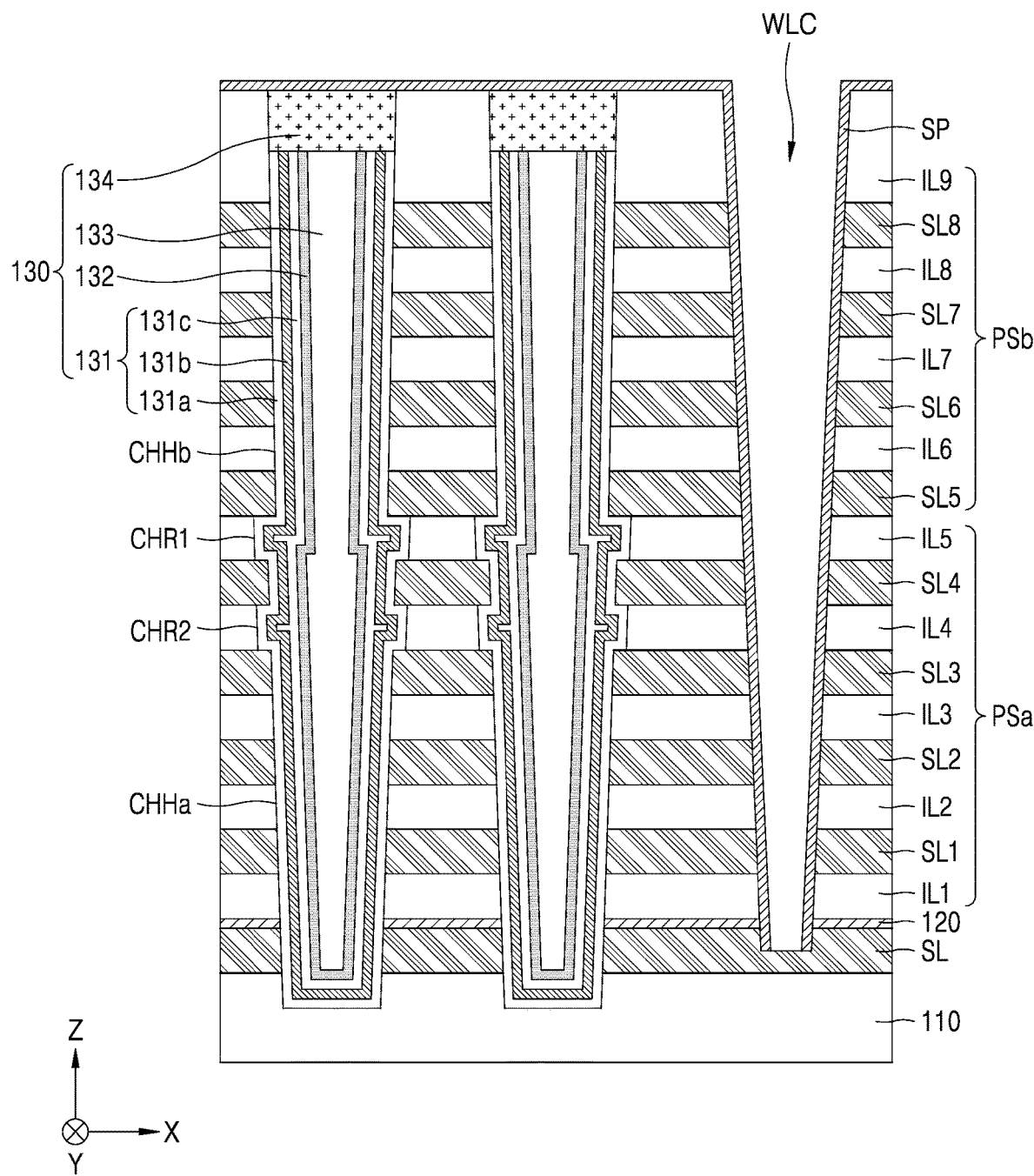

Referring to FIG. 8K, a cover layer SP that covers the upper surface of the uppermost layer IL9 among the plurality of second interlayer insulating layers IL6 to IL9 and the side surfaces of the word line cut WLC and that may not cover the lower end of the word line cut WLC may be formed. Specifically, the cover layer SP may be formed using a deposition method that does not have excellent step coverage characteristics. Accordingly, the lower sacrificial layer SL may be exposed to the word line cut WLC by the cover layer SP.

Figure 8L:
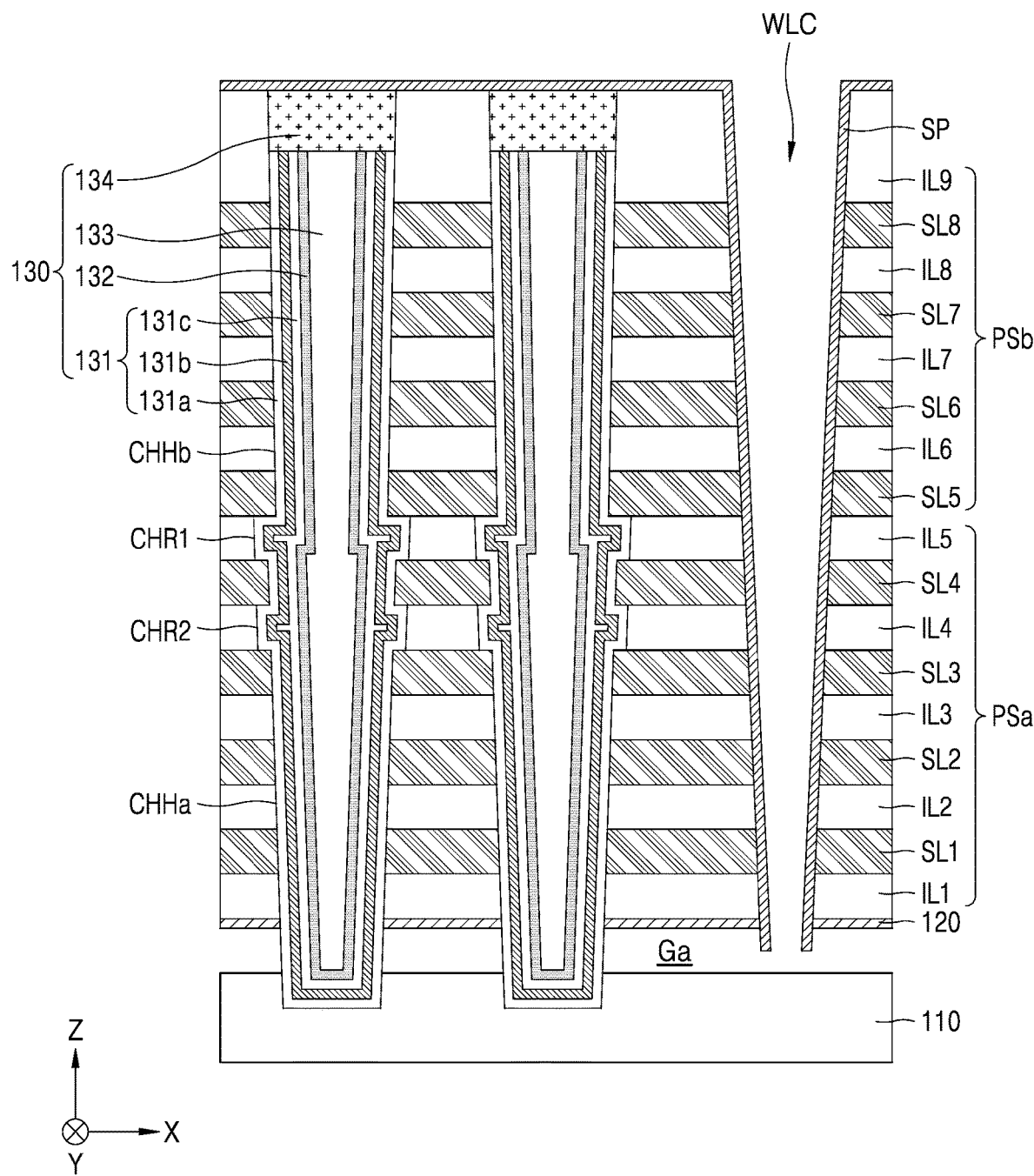

Referring to FIGS. 8K and 8L, a gap Ga may be formed between the substrate 110 and the lower etch stop layer 120 by removing the lower sacrificial layer SL. A part of the sidewall of the channel structure 130 may be exposed to the gap Ga between the substrate 110 and the lower etch stop layer 120. The etchant may be transferred to the lower sacrificial layer SL through the word line cut WLC. The lower etch stop layer 120 and the cover layer SP may protect/prevent the first preliminary stack structure PSa and the second preliminary stack structure PSb from being etched while removing the lower sacrificial layer SL.

Figure 8M:
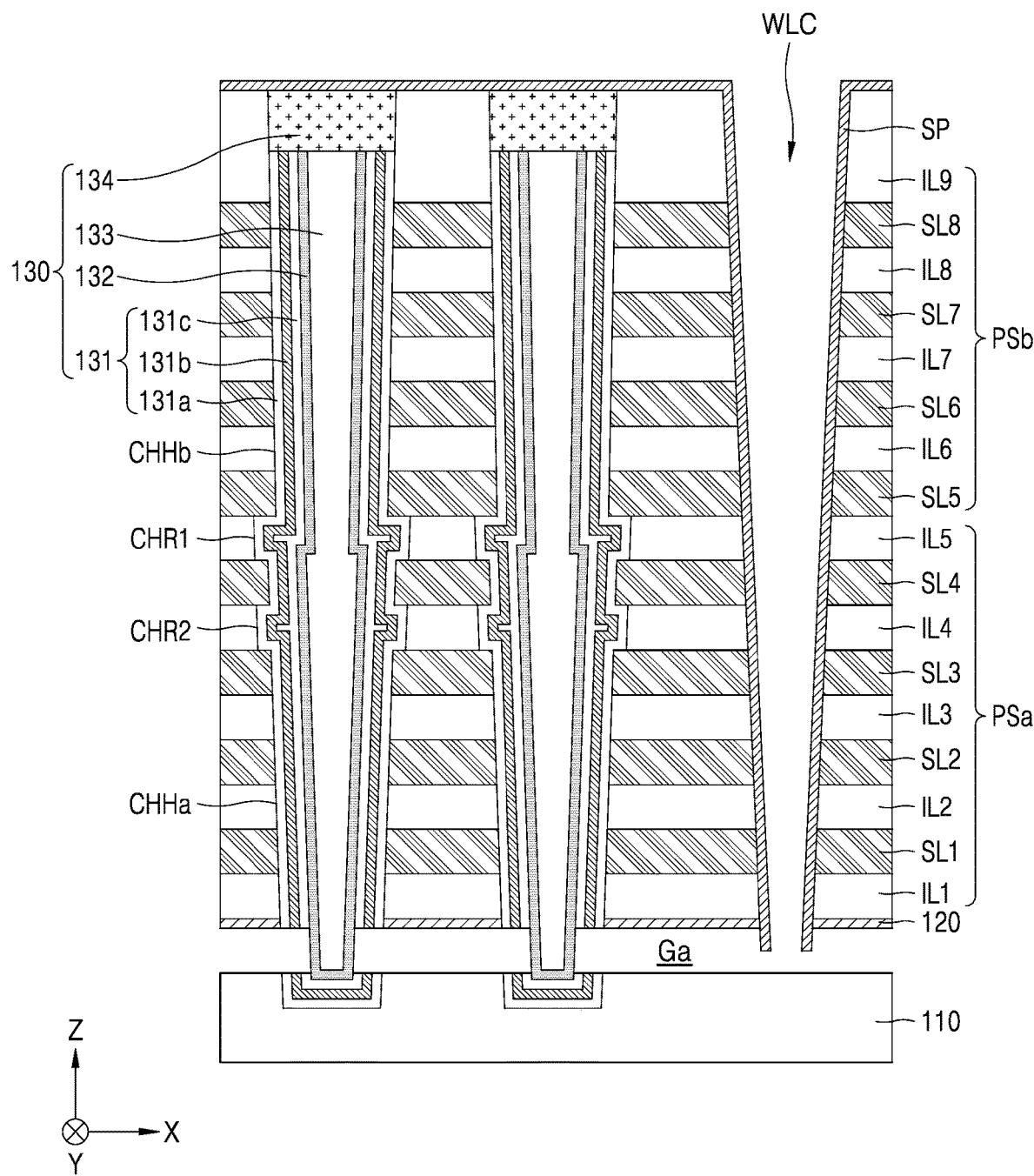

Referring to FIGS. 8L and 8M, the channel layer 132 may be exposed to the gap Ga between the substrate 110 and the lower etch stop layer 120 by removing a part of the gate insulating layer 131 exposed by the gap Ga between the substrate 110 and the lower etch stop layer 120.

Figure 8N:
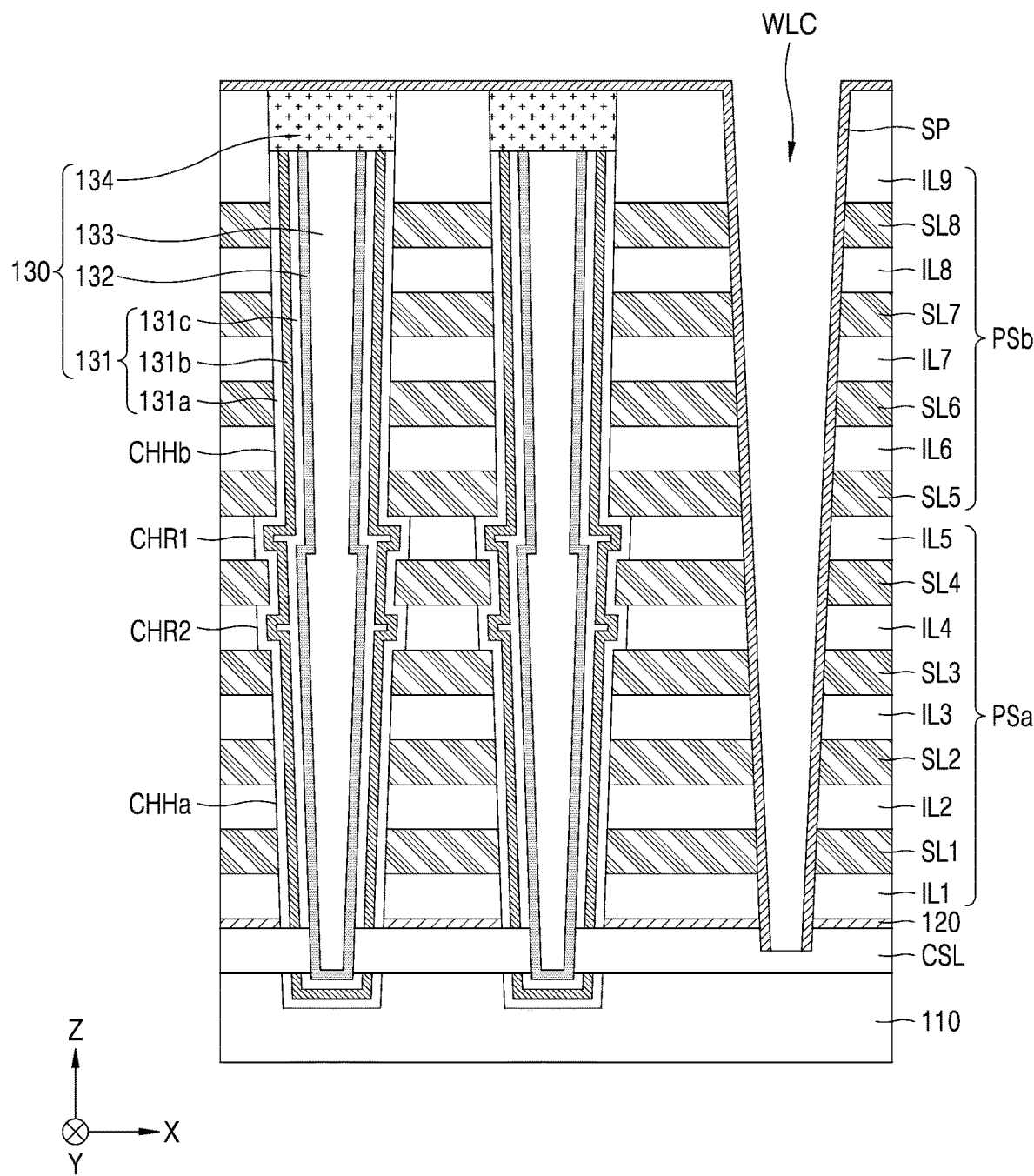
Figure 80:
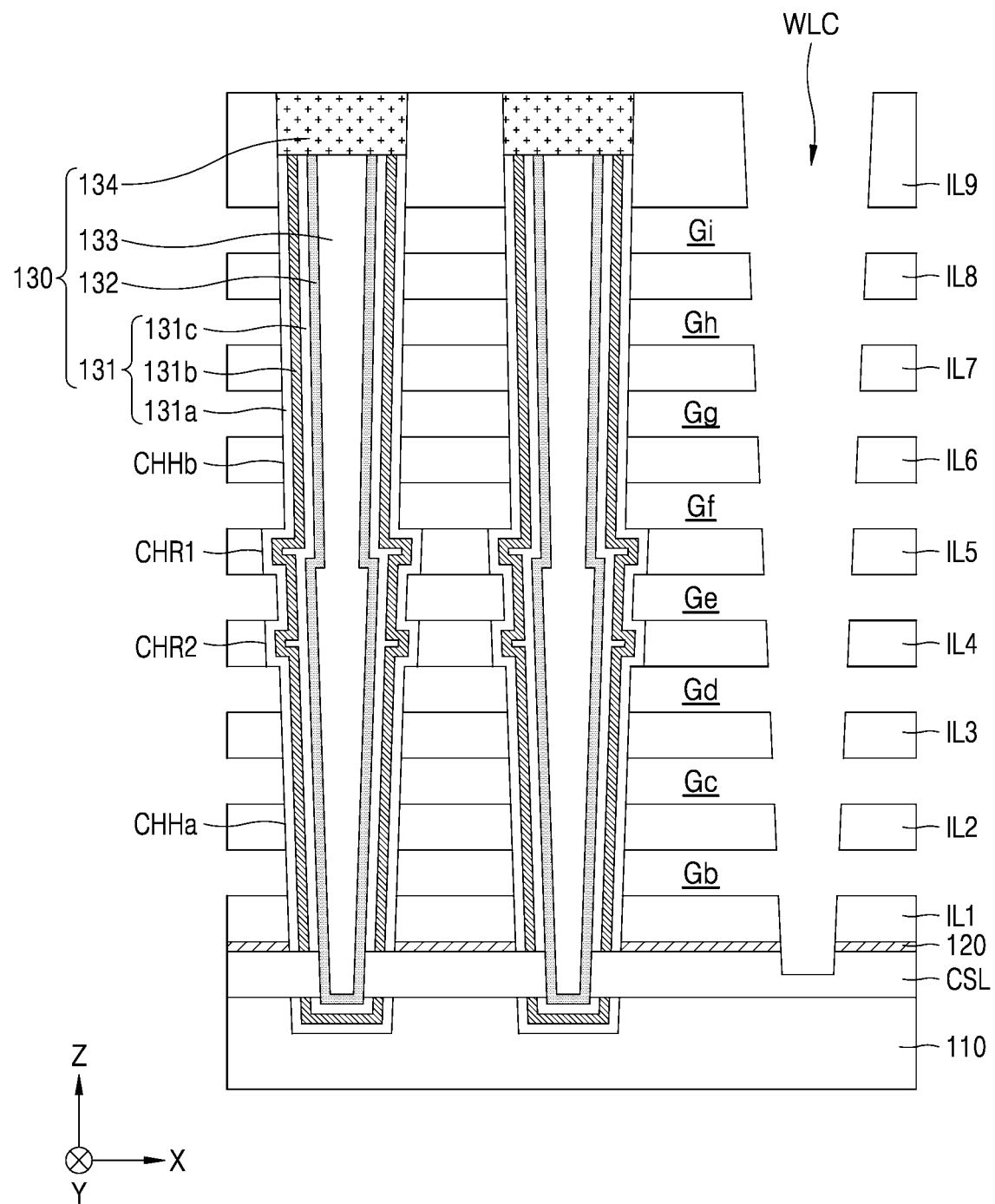

Referring to FIGS. 8M and 8N, the common source line CSL may be filled in the gap Ga between the substrate 110 and the lower etch stop layer 120. The common source line CSL may be formed to contact the channel layer 132.

Referring to FIGS. 7 and 8N to 8P, the plurality of first sacrificial layers SL1 to SL4 and the plurality of second sacrificial layers SL5 to SL8 may be replaced with the plurality of first gate layers GL1, GL2, DGL1, and DGL2 and the plurality of second gate layers DGL3, DGL4, GL3, and GL4, respectively (S1900). Specifically, the plurality of first sacrificial layers SL1 to SL4 and the plurality of second sacrificial layers SL5 to SL8 may be exposed to the word line cut WLC by removing the cover layer SP. Subsequently, a plurality of gaps Gb to Gi may be formed between the plurality of first interlayer insulating layers IL1 to IL4 and the plurality of second interlayer insulating layers IL5 to IL9 by removing the plurality of first sacrificial layers SL1 to SL4 and the plurality of second sacrificial layers SL5 to SL8. The etchant may be transferred to the plurality of first sacrificial layers SL1 to SL4 and the plurality of second sacrificial layers SL5 to SL8 through the word line cut WLC. The plurality of gaps Gb to Gi may expose portions of side surfaces of the channel structure 130. Next, the plurality of first gate layers GL1, GL2, DGL1, and DGL2 and the plurality of second gate layers DGL3, DGL4, GL3, and GL4 may be formed in the plurality of gaps Gb to Gi between the plurality of first interlayer insulating layers IL1 to IL4 and the plurality of second interlayer insulating layers IL5 to IL9.

Referring to FIG. 2A, an insulating structure 150 may be formed in the word line cut WLC. The memory device 100 illustrated in FIG. 2A may be manufactured according to the method 1000 of manufacturing the memory device described with reference to FIGS. 8A through 8P. According to the method 1000 of manufacturing the memory device of the present disclosure, even if the second channel hole CHHb is misaligned with the first channel hole CHHa, because the second channel hole CHHb may be inhibited/prevented from penetrating the first active gate layers GL1 and GL2, the yield of the manufacturing process of the memory device 100 may be improved. In addition, because the need to form a thick upper first interlayer insulating layer IL5 to inhibit/prevent the second channel hole CHHb from penetrating the first active gate layers GL1 and GL2 is reduced, the memory device 10 (see FIG. 1) having an increased current and a reduced threshold voltage by reducing the height of the upper first interlayer insulating layer IL5 may be manufactured without greatly reducing the yield of the manufacturing process.

Figure 10:
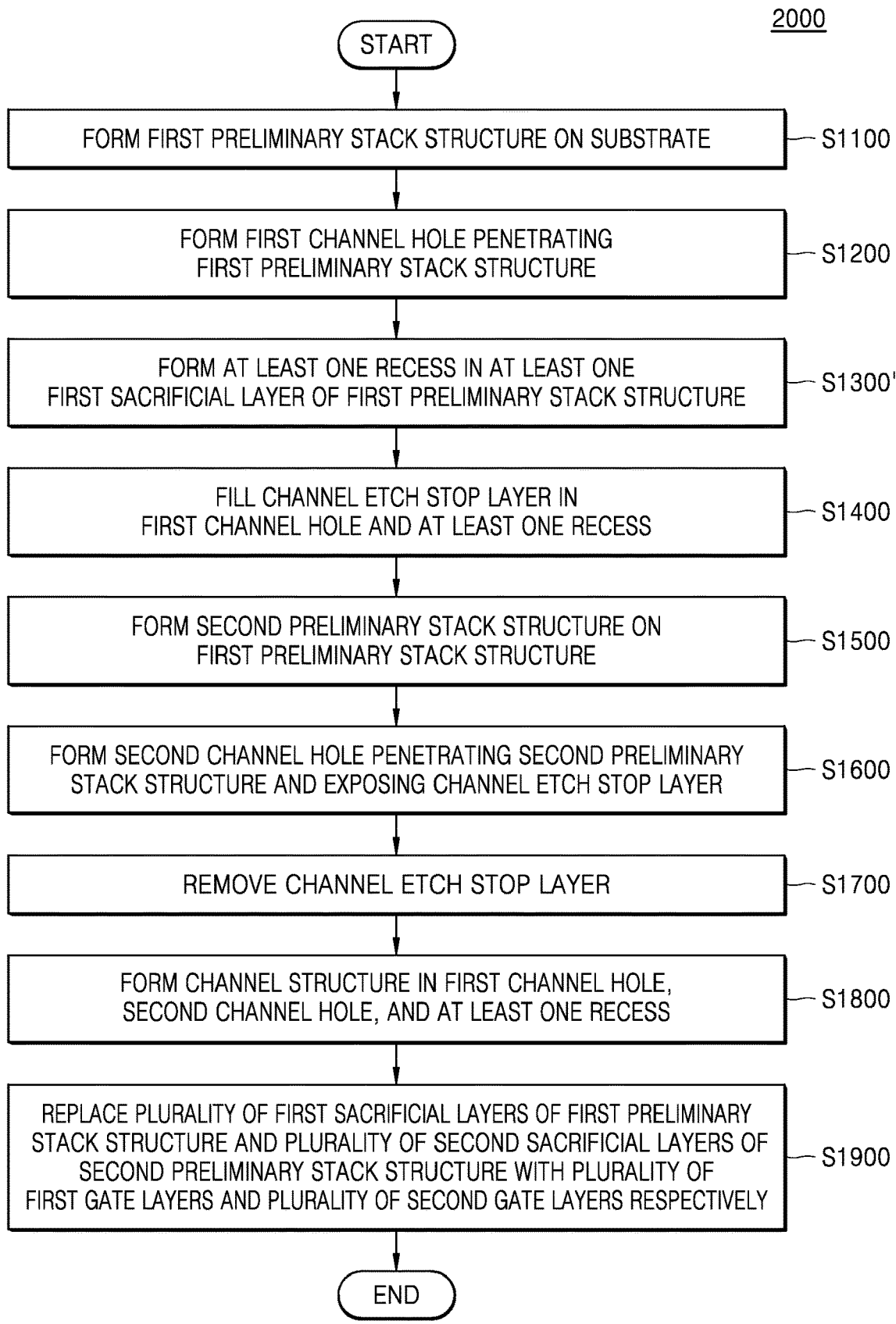
FIG. 10 is a flowchart schematically illustrating a method of manufacturing a memory device according to an embodiment of the present disclosure.

FIG. 10 is a flowchart schematically illustrating a method 2000 of manufacturing a memory device according to an embodiment of the present disclosure. FIGS. 11A through 11E are schematic cross-sectional views illustrating the method 2000 of manufacturing the memory device according to an embodiment of the present disclosure.

According to the method 2000 of manufacturing the memory device illustrated in FIG. 10, the memory device 200 illustrated in FIGS. 6A and 6B may be manufactured. Upon comparing FIGS. 7 and 10, the method 2000 of manufacturing the memory device may include an operation (S1300') of forming at least one recess in at least one first sacrificial layer of a first preliminary stack structure instead of an operation (S1300) of forming at least one recess in at least one first interlayer insulating layer of the first preliminary stack structure. The operation (S1300') of forming the at least one recess is described in more detail below with reference to FIGS. 11A and 11B.

Figure 11A:
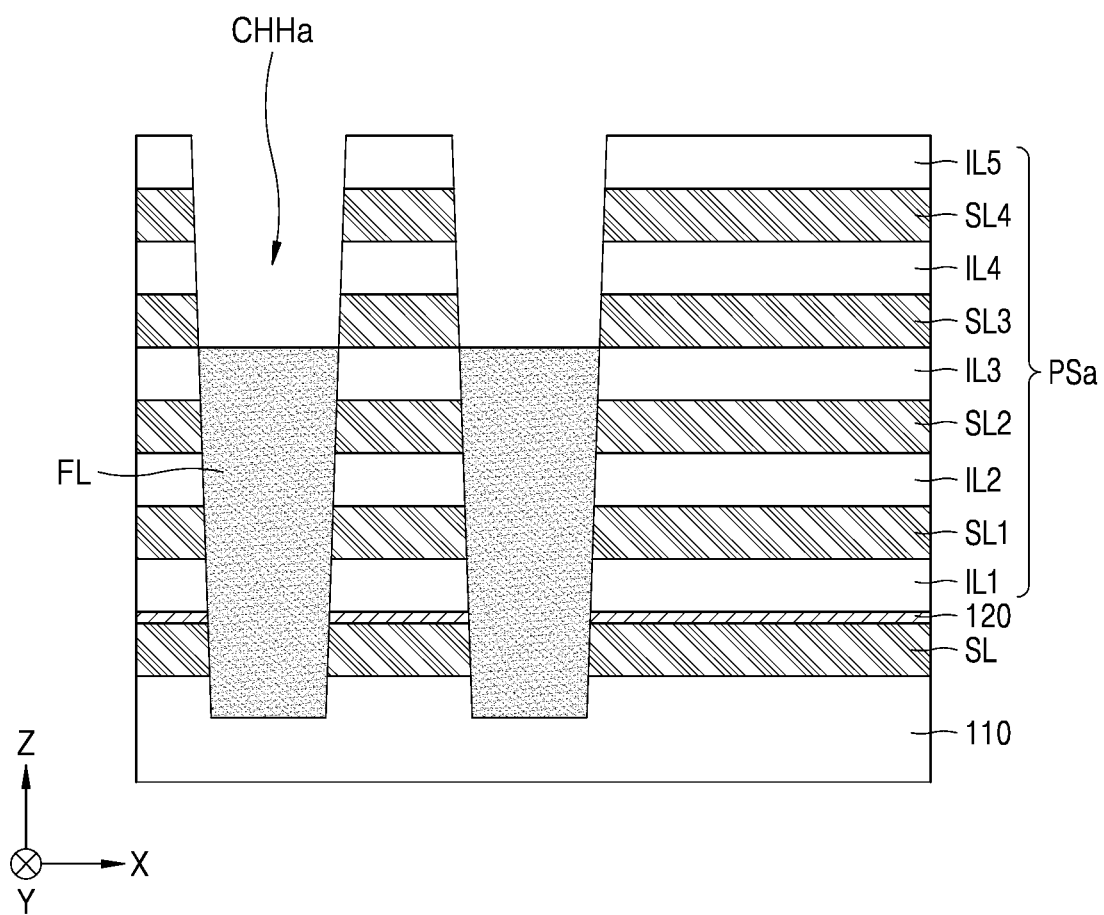
FIGS. 11A through 11E are schematic cross-sectional views illustrating a method of manufacturing the memory device according to an embodiment of the present disclosure.

Referring to FIG. 11A, the sacrificial filling layer FL that exposes at least one (e.g., the upper first sacrificial layer SL4 and the lower first sacrificial layer SL3) of the plurality of first sacrificial layers SL1 to SL4 to the first channel hole CHHa and covers the remaining ones (e.g., SL1 and SL2) of the plurality of first sacrificial layers SL1 to SL4 may be formed in the first channel hole CHHa. Specifically, the sacrificial filling layer FL is filled in the first channel hole CHHa and the upper portion of the sacrificial filling layer FL may be removed such that at least one (e.g., SL3 and SL4) of the plurality of first sacrificial layers SL1 to SL4 is exposed to the first channel hole CHHa by the sacrificial filling layer FL.

Figure 11B:
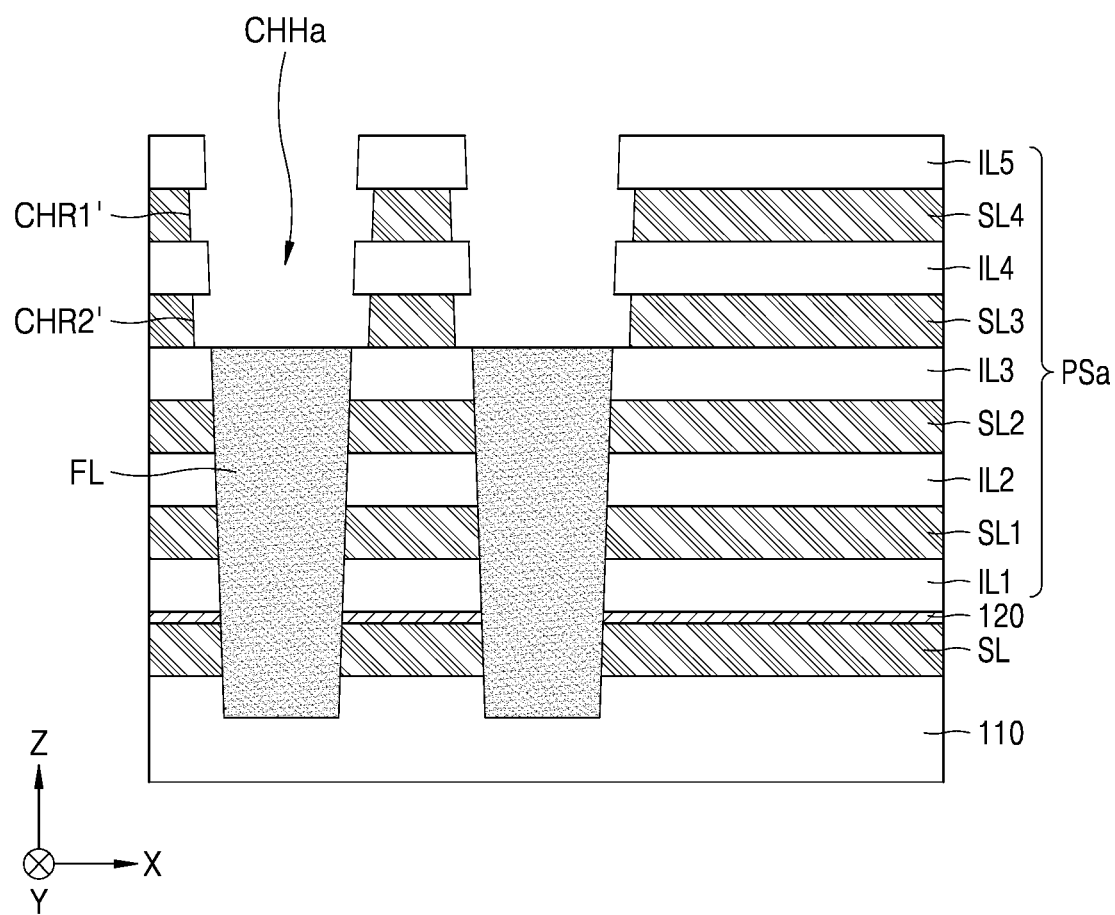

Referring to FIG. 11B, at least one recess (e.g., CHR1' and CHR2') that is recessed into at least one first sacrificial layer (e.g., SL3 and SL4) exposed by the filling layer FL from the side surface of the first channel hole CHHa may be formed. Specifically, the first recess CHR1' in the upper first sacrificial layer SL4 and the second recess CHR2' in the lower first sacrificial layer SL3 may be formed by removing, for example, horizontally etching, a portion exposed to the first channel hole CHHa of the upper first sacrificial layer SL4 and the lower first sacrificial layer SL3. To selectively etch the first sacrificial layers SL3 and SL4, an etchant having a higher etching rate with respect to a material constituting the first sacrificial layers SL3 and SL4 than an etching rate with respect to a material constituting the first interlayer insulating layers IL4 and IL5 may be used.

The upper first sacrificial layer SL4 and the lower first sacrificial layer SL3 may be replaced with the upper first dummy gate layer DGL2 (see FIG. 11E) and the lower first dummy gate layer DGL1 (see FIG. 11E) during operation (S1900, see FIG. 10) of replacing the plurality of first sacrificial layers SL1 to SL4 of the first preliminary stack structure and the plurality of second sacrificial layers SL5 to SL8 of the second preliminary stack structure with the plurality of first gate layers GL1, GL2, DGL1, and DGL2 and the plurality of second gate layers DGL3, DGL4, GL3, and GL4, respectively.

Figure 11C:
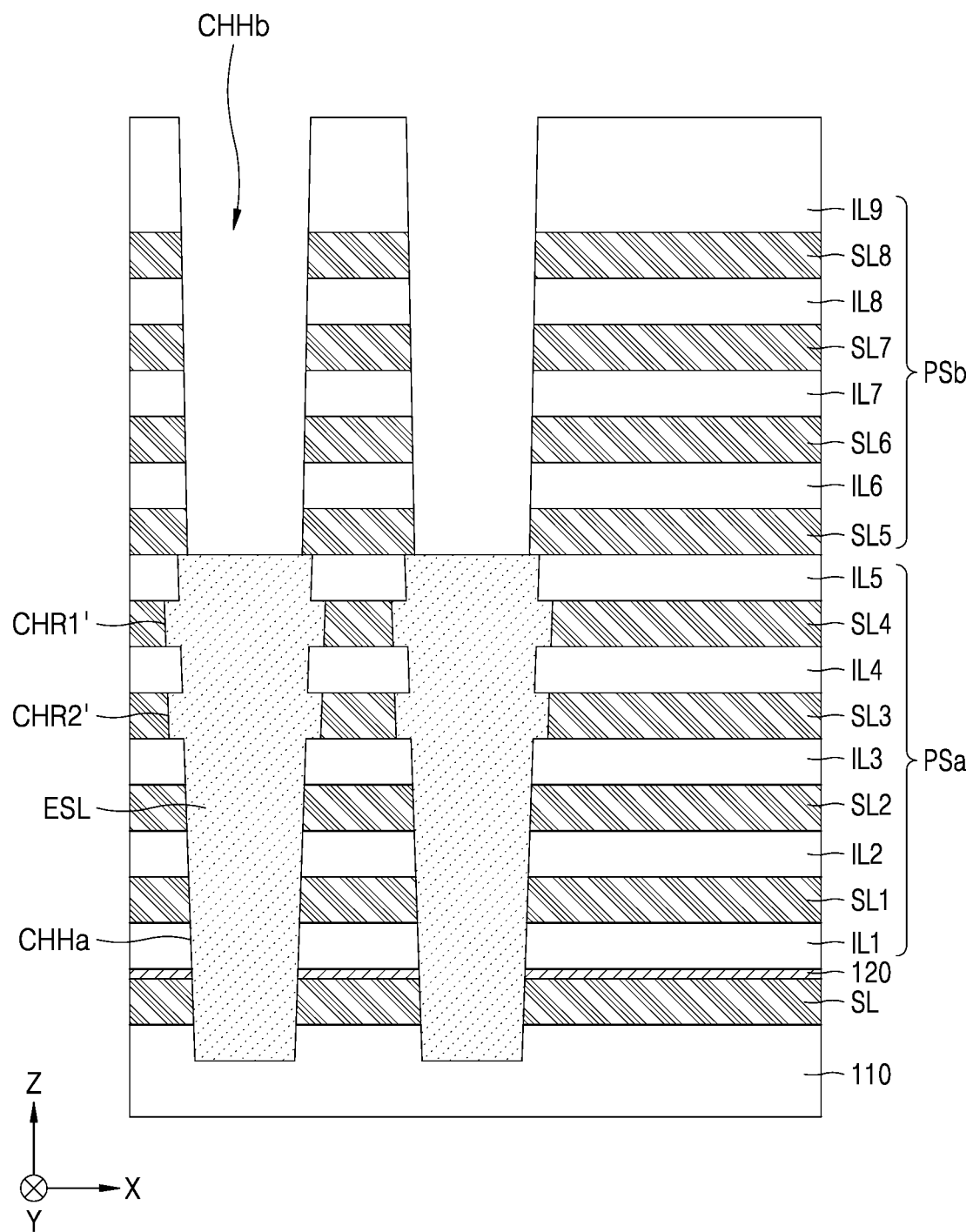

FIG. 11C illustrates operation (S1600) of forming the second channel hole CHHb of the method 2000 of manufacturing the memory device of FIG. 10.

Referring to FIGS. 6A, 6B, and 11C, when forming the second channel hole CHHb (S1600, see FIG. 10), because the planar area of the channel etch stop layer ESL increases as a depth d1' of the first recess CHR1' in the horizontal direction (X direction) and a depth d2' of the second recess CHR2' in the horizontal direction (X direction) increase, even if the second channel hole CHHb is misaligned with the first channel hole CHHa, it may be advantageous to inhibit/prevent the second channel hole CHHb from being recessed too deeply into the first preliminary stack structure PSa. Therefore, as the depth d1' of the first recess CHR1' in the horizontal direction (X direction) and the depth d2' of the second recess CHR2' in the horizontal direction (X direction) increase, the process yield of operation (S1600, see FIG. 10) of forming the second channel hole CHHb may increase.

Figure 11D:
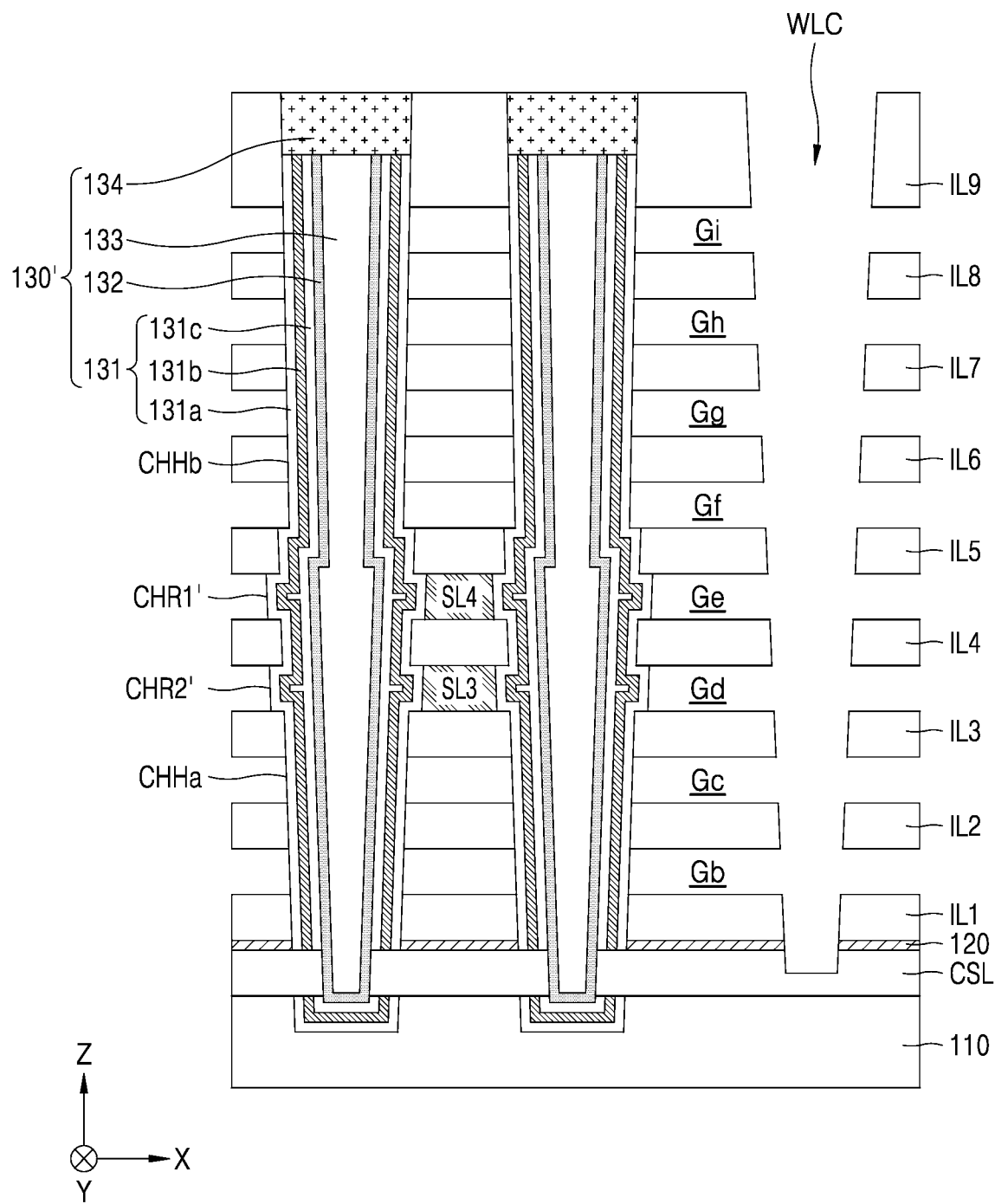
Figure 11E:
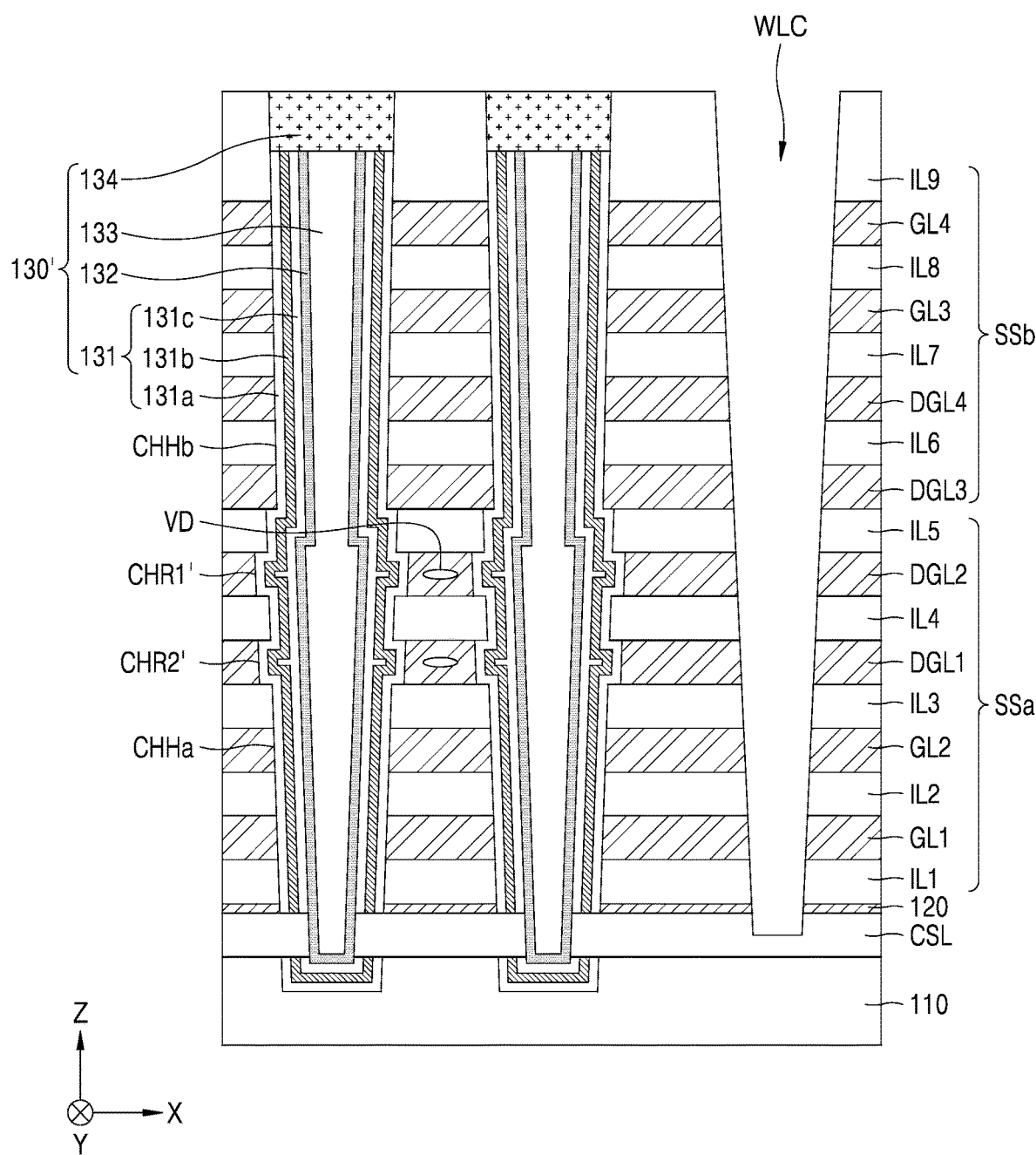

FIGS. 11D and 11E illustrate operation (S1900) of replacing the plurality of first sacrificial layers SL1 to SL4 and the plurality of second sacrificial layers SL5 to SL8 with the plurality of first gate layers GL1, GL2, DGL1, and DGL2 and the plurality of second gate layers DGL3, DGL4, GL3, and GL4, respectively, of the method 2000 of manufacturing the memory device of FIG. 10.

Referring to FIGS. 6A, 6B, 11D, and 11E, meanwhile, when the depth d1' of the first recess CHR1' in the horizontal direction (X direction) or the depth d2' of the second recess CHR2' in the horizontal direction (X direction) is greater than about 10 nm, because a distance dHH1 between the neighboring first recesses CHR1' in the horizontal direction (X direction) or a distance dHH2 between the neighboring second recesses CHR2' in the horizontal direction (X direction) decreases too much, it may be difficult to remove a portion of the upper first sacrificial layer SL4 between the first recesses CHR1' or a portion of the lower first sacrificial layer SL3 between the second recesses CHR2'. Alternatively, when the depth d1' of the first recess CHR1' in the horizontal direction (X direction) or the depth d2' of the second recess CHR2' in the horizontal direction (X direction) is greater than about 10 nm, because the distance dHH1 between the neighboring first recesses CHR1' in the horizontal direction (X direction) or the distance dHH2 between the neighboring second recesses CHR2' in the horizontal direction (X direction) decreases too much, a void VD may be formed in the upper first dummy gate layer DGL2 or the lower first dummy gate layer DGL1. Therefore, when the depth d1' of the first recess CHR1' in the horizontal direction (X direction) or the depth d2' of the second recess CHR2' in the horizontal direction (X direction) exceeds about 10 nm, the process yield of operation (S1900) of replacing the plurality of first sacrificial layers SL1 to SL4 and the plurality of second sacrificial layers SL5 to SL8 with the plurality of first gate layers GL1, GL2, DGL1, and DGL2 and the plurality of second gate layers DGL3, DGL4, GL3, and GL4, respectively, may be reduced.

Therefore, in the memory device 200 illustrated in FIGS. 6A and 6B, each of the depth d1' of the first recess CHR1' in the horizontal direction (X direction) and the depth d2' of the second recess CHR2' in the horizontal direction (X direction) may be greater than 0 nm and may be less than or equal to about 10 nm. That is, each of the protrusion length d1' of the first protrusion 130p1' of the channel structure 130' in the horizontal direction (X direction) and the protrusion length d2' of the second protrusion 130p2' of the channel structure 130' in the horizontal direction (X direction) may be greater than 0 nm and may be less than or equal to about 10 nm.

Meanwhile, in the memory device 100 shown in FIGS. 2A and 2B, because the first recess CHR1 and the second recess CHR2 may be formed respectively in the upper first interlayer insulating layer IL5 and the lower first interlayer insulating layer IL4, the depth d1 of the first recess CHR1 in the horizontal direction (X direction) and the depth d2 of the second recess CHR2 in the horizontal direction (X direction) may not greatly influence a replacing operation (S1900) of the method 1000 of manufacturing the memory device. Therefore, in some embodiments, the depth d1 of the first recess CHR1 in the horizontal direction (X direction) or the depth d2 of the second recess CHR2 in the horizontal direction (X direction) may be greater than about 10 nm.

While the inventive concept has been particularly shown and described with reference to embodiments thereof, it will be understood that various changes in form and details may be made therein without departing from the scope of the following claims.

What is claimed is:

1. A memory device comprising:
a substrate;
a first stack structure comprising a plurality of first gate layers and a plurality of first interlayer insulating layers alternately stacked on the substrate;
a second stack structure comprising a plurality of second gate layers and a plurality of second interlayer insulating layers alternately stacked on the first stack structure; and
a channel structure penetrating the first stack structure and the second stack structure,
wherein the channel structure comprises a first portion in a first channel hole penetrating the first stack structure, a second portion in a second channel hole penetrating the second stack structure, and a first protrusion located in a first recess recessed into one layer of the plurality of first interlayer insulating layers from a side portion of the first channel hole, and
wherein the channel structure further comprises a second protrusion located in a second recess recessed into another layer among the plurality of first interlayer insulating layers from the side portion of the first channel hole.

2. The memory device of claim 1, wherein the one layer of the plurality of first interlayer insulating layers is an uppermost layer among the plurality of first interlayer insulating layers.

3. The memory device of claim 2,
wherein the another layer among the plurality of first interlayer insulating layers is a second highest layer among the plurality of first interlayer insulating layers, and
wherein a vertical thickness of the uppermost layer among the plurality of first interlayer insulating layers in a vertical direction is substantially equal to a vertical thickness of the second highest layer among the plurality of first interlayer insulating layers in the vertical direction.

4. The memory device of claim 1,
wherein the channel structure comprises a gate insulating layer in the first channel hole, the first recess, and the second channel hole, and a channel layer on the gate insulating layer, and
wherein the channel layer is located outside the first recess.

5. The memory device of claim 4,
wherein a first portion of the gate insulating layer is located inside the first recess, and
wherein a second portion of the gate insulating layer is located outside the first recess.

6. The memory device of claim 5,
wherein the gate insulating layer comprises a blocking insulating layer in the first channel hole, the first recess, and the second channel hole, a charge storage layer on the blocking insulating layer, and a tunneling insulating layer on the charge storage layer,
wherein a first portion of the blocking insulation layer is located inside the first recess,
wherein a second portion of the blocking insulation layer is located outside the first recess, and
wherein the tunneling insulating layer is located entirely outside the first recess.

7. The memory device of claim 6,
wherein a first portion of the charge storage layer is located inside the first recess, and
wherein a second portion of the charge storage layer is located outside the first recess.

8. The memory device of claim 6, wherein the charge storage layer is located entirely outside the first recess.

9. The memory device of claim 1, wherein the second portion of the channel structure is in contact with the first portion and the first protrusion of the channel structure.

10. The memory device of claim 1,
wherein the another layer among the plurality of first interlayer insulating layers is a second highest layer among the plurality of first interlayer insulating layers, and
wherein a dummy gate layer among the plurality of first gate layers is between the one layer of the plurality of first interlayer insulating layers and the another layer among the plurality of first interlayer insulating layers.

11. The memory device of claim 1, wherein the second portion of the channel structure is in contact with the first portion, the first protrusion, and the second protrusion of the channel structure.

12. A memory device comprising:
a substrate;
a first stack structure comprising a plurality of first gate layers and a plurality of first interlayer insulating layers alternately stacked on the substrate;
a second stack structure comprising a plurality of second gate layers and a plurality of second interlayer insulating layers alternately stacked on the first stack structure; and
a channel structure penetrating the first stack structure and the second stack structure,
wherein the plurality of first gate layers comprises a plurality of first active gate layers stacked on the substrate and an upper first dummy gate layer on the plurality of first active gate layers,
wherein the plurality of first interlayer insulating layers comprises an upper first interlayer insulating layer on the upper first dummy gate layer and a lower first interlayer insulating layer below the upper first dummy gate layer,
wherein a planar area of a portion of the channel structure penetrating the upper first dummy gate layer is greater than a planar area of a portion of the channel structure penetrating the upper first interlayer insulating layer and a planar area of a portion of the channel structure penetrating the lower first interlayer insulating layer,
wherein a planar area of a portion of the channel structure penetrating a lowermost layer among the plurality of second gate layers is less than the planar area of the portion of the channel structure penetrating the upper first interlayer insulating layer;
wherein the plurality of first gate layers further comprise a lower first dummy gate layer between the plurality of first active gate layers and the upper first dummy gate layer, and
wherein a planar area of a portion of the channel structure penetrating the lower first dummy gate layer is greater than the planar area of the portion of the channel structure penetrating the lower first interlayer insulating layer.

13. The memory device of claim 12, wherein a chemical composition of the upper first dummy gate layer is substantially same as a chemical composition of one of the plurality of first active gate layers.

14. A memory device comprising:
a substrate;
a first stack structure comprising a plurality of first active gate layers on the substrate, a plurality of first dummy gate layers on the plurality of first active gate layers, and a plurality of first interlayer insulating layers separating the plurality of first active gate layers and the plurality of first dummy gate layers from each other;
a second stack structure comprising a plurality of second gate layers on the first stack structure, and a plurality of second interlayer insulating layers separating the plurality of second gate layers from each other; and
a plurality of channel structures each penetrating the first stack structure and the second stack structure,
wherein each of the plurality of channel structures comprises a first portion penetrating the first stack structure, a second portion penetrating the second stack structure, and a plurality of protrusions vertically overlapping each other and protruding from a side surface of the first portion.

15. The memory device of claim 14, wherein some of the plurality of protrusions of each of the plurality of channel structures are between the plurality of first dummy gate layers.

16. The memory device of claim 14, wherein the plurality of protrusions of each of the plurality of channel structures are respectively located in some of the plurality of first interlayer insulating layers.

17. The memory device of claim 14, wherein the plurality of protrusions of each of the plurality of channel structures are respectively located in the plurality of first dummy gate layers.

18. The memory device of claim 14, wherein a protrusion length of the plurality of protrusions of each of the plurality of channel structures in a horizontal direction is greater than 0 nanometers (nm) and less than or equal to about 10 nm.

19. The memory device of claim 14, wherein a vertical thickness of an uppermost layer among the plurality of first interlayer insulating layers in a vertical direction is substantially equal to a vertical thickness of a second highest layer among the plurality of first interlayer insulating layers in the vertical direction.

20. The memory device of claim 14, wherein the plurality of first active gate layers and the plurality of first dummy gate layers each comprise a metal layer.

* * * * *